United States Patent
Kwon et al.

(10) Patent No.: US 10,561,022 B2
(45) Date of Patent: Feb. 11, 2020

(54) DISPLAY DEVICE

(71) Applicant: Samsung Display Co., Ltd., Yongin-si, Gyeonggi-do (KR)

(72) Inventors: Soonkyeong Kwon, Seoul (KR); Namsoo Kang, Asan-si (KR); Sunghyun Kim, Hwaseong-si (KR); Yoonsup Kim, Suwon-si (KR); Sewon Min, Asan-si (KR); Kihyun Sung, Incheon (KR); Junyong Ahn, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/246,267

(22) Filed: Jan. 11, 2019

(65) Prior Publication Data

US 2019/0223294 A1  Jul. 18, 2019

(30) Foreign Application Priority Data

Jan. 17, 2018 (KR) .......................... 10-2018-0006295

(51) Int. Cl.
| | |
|---|---|
| *H05K 1/18* | (2006.01) |
| *H01L 51/00* | (2006.01) |
| *H01L 27/32* | (2006.01) |
| *G09F 9/30* | (2006.01) |
| *H01L 51/56* | (2006.01) |

(52) U.S. Cl.
CPC ............. *H05K 1/189* (2013.01); *G09F 9/301* (2013.01); *H01L 27/3276* (2013.01); *H01L 51/0097* (2013.01); *H01L 51/56* (2013.01); *H05K 2201/10128* (2013.01)

(58) Field of Classification Search
USPC ........................................................ 361/749
See application file for complete search history.

(56) References Cited

FOREIGN PATENT DOCUMENTS

| KR | 10-1269289 B1 | 5/2013 |
|---|---|---|
| KR | 10-2017-0005535 A | 1/2017 |
| KR | 10-2017-0080114 A | 7/2017 |

*Primary Examiner* — Andargie M Aychillhum
(74) *Attorney, Agent, or Firm* — Lewis Roca Rothgerber Christie LLP

(57) ABSTRACT

A display device includes a display panel having a display region and a pad region on a side of the display region, a first printed circuit board spaced apart from the pad region and includes a first driving controller configured to generate a plurality of signals, a second printed circuit board adjacent to the first printed circuit board, a first driving film connected to the first printed circuit board, a second driving film connected to the second printed circuit board, a first signal transmission film connected to the first printed circuit board and including first signal transmission wirings, and a second signal transmission film connected to the second printed circuit board and the first signal transmission film and including second signal transmission wirings.

19 Claims, 11 Drawing Sheets

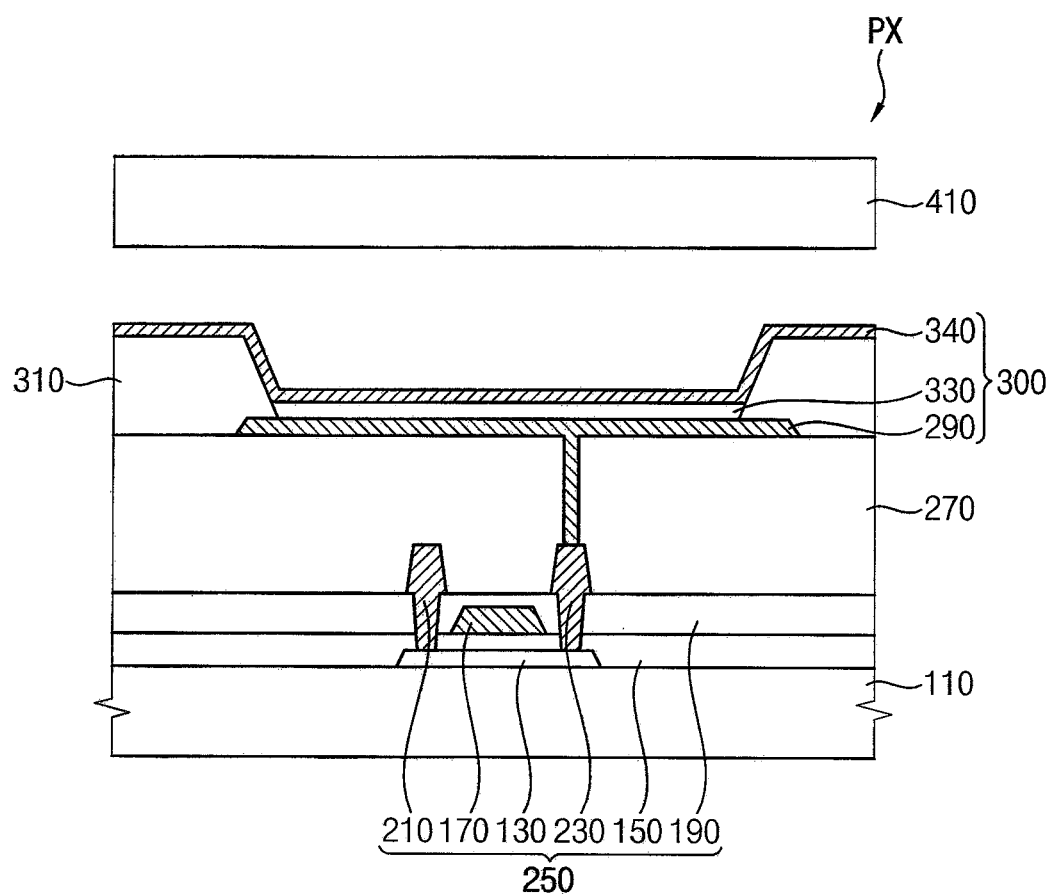

DISPLAY DEVICE

CROSS-REFERENCE TO RELATED APPLICATION

This application claims priority to and the benefit of Korean Patent Applications No. 10-2018-0006295, filed on Jan. 17, 2018 in the Korean Intellectual Property Office (KIPO), the content of which is incorporated herein in its entirety by reference.

BACKGROUND

1. Field

Example embodiments relate generally to a display device. More particularly, embodiments of the present inventive concept relate to a curved display device.

2. Description of the Related Art

A flat panel display (FPD) device is widely utilized as a display device of an electronic device because the FPD device is lightweight and thin compared to a cathode-ray tube (CRT) display device. Typical examples of the FPD device are a liquid crystal display (LCD) device and an organic light emitting display (OLED) device.

A size of a screen of the FPD device has been increased when the FPD device is utilized as a display device of a television receiver. As the size of the screen of the FPD device increases, the picture quality at different viewing angles may vary depending on whether a viewer sees the center or the left and/or right end of the screen. In order to compensate for a viewing angle difference, the FPD device may be formed as a curved type (e.g., with a curved shape) including a concave type (e.g., with a concave shape) or a convex type (e.g., with a convex shape). A curved display device may be a portrait type in which a vertical length is longer than a horizontal length (or width) thereof and which is curved in a vertical direction, or a landscape type in which the vertical length is shorter than the horizontal length thereof and which is curved in a horizontal direction.

The curved display device may generally include a display panel for displaying an image, a first printed circuit board (PCB) including a driving controller generating signals to display the image in the display panel, a second PCB that does not include the driving controller, and a driving film that connects the first and second PCBs and the display panel. Here, the curved display device may further include a connection cable that connects the first PCB including the driving controller and the second PCB excluding (e.g., without) the driving controller. However, because the display panel includes (e.g., has) a curved shape, the connection cable may be damaged when the first and second PCBs are located on a lower surface of the display device by bending the driving film. Accordingly, a failure of the display device may occur. In addition, when the display device includes a connection cable having a relatively increased distance such that the connection cable may not be damaged, a manufactured cost of the display device may be increased.

SUMMARY

Aspects of some example embodiments are directed toward a chip on film package.

Aspects of some example embodiments are directed toward a curved display device.

According to some example embodiments, a display device includes a display panel, a first printed circuit board, a second printed circuit board, a first driving film, a second driving film, a first signal transmission film, and a second signal transmission film. The display panel has a display region and a pad region at a side of the display region. The first printed circuit board is spaced apart from the pad region of the display panel, and includes a first driving controller configured to generate a plurality of signals. The second printed circuit board is adjacent to the first printed circuit board. The first driving film is electrically connected to the first printed circuit board, and includes a first driving integrated circuit. The second driving film is electrically connected to the second printed circuit board, and includes a second driving integrated circuit. The first signal transmission film is electrically connected to the first printed circuit board, and includes first signal transmission wirings. The second signal transmission film is electrically connected to the second printed circuit board and the first signal transmission film, and includes second signal transmission wirings.

In example embodiments, the first driving film may be in a first portion of the first printed circuit board, and the first signal transmission film may be in a second portion of the first printed circuit board different from the first portion of the first printed circuit board. The second driving film may be in a first portion of the second printed circuit board, and the second signal transmission film may be in a second portion of the second printed circuit board different from the first portion of the second printed circuit board. The first driving film and the first signal transmission film may be coupled to the display panel and the first printed circuit board, and the second driving film and the second signal transmission film may be coupled to the display panel and the second printed circuit board.

In example embodiments, the second portion of the first printed circuit board and the second portion of the second printed circuit board may be between the first portion of the first printed circuit board and the first portion of the second printed circuit board.

In example embodiments, the first signal transmission film and the second signal transmission film may be between the first driving film and the second driving film.

In example embodiments, the display device may further include first connection electrodes in the pad region corresponding to a portion where the first signal transmission film and the second signal transmission film are in the pad region of the display panel. A first side of the first connection electrodes (e.g., a first side of each first connection electrode of a plurality of first connection electrodes) may be coupled to the first signal transmission film, and a second side of the first connection electrodes (e.g., a second side of each first connection electrode of the plurality of first connection electrodes) may be coupled to the second signal transmission film.

In example embodiments, the first driving controller may be configured to generate a first signal and a second signal, and the first signal may be provided to the display panel through the first driving film. The second signal may be provided to the display panel through the second driving film after the second signal is transferred to the second printed circuit board through the first signal transmission film, the second signal transmission film, and the first connection electrodes.

In example embodiments, each of the first signal transmission film and the second signal transmission film may not include a driving integrated circuit.

In example embodiments, the second printed circuit board may not include a driving controller.

In example embodiments, the display device may further include a third signal transmission film, a third printed circuit board, a third driving film, and a fourth signal transmission film. The third signal transmission film may be electrically connected to the second printed circuit board, and may include third signal transmission wirings. The third printed circuit board may be adjacent to the second printed circuit board. The third driving film may be electrically connected to the third printed circuit board, and may include a third driving integrated circuit. The fourth signal transmission film may be electrically connected to the third printed circuit board and the third signal transmission film, and may include fourth signal transmission wirings.

In example embodiments, the second driving film may be in a first portion of the second printed circuit board, and the second signal transmission film may be in a second portion of the second printed circuit board. The third signal transmission film may be in a third portion opposite to the first portion of the second printed circuit board, and the first portion of the second printed circuit board may be different from the second portion of the second printed circuit board. The third driving film may be in a first portion of the third printed circuit board, and the fourth signal transmission film may be in a second portion of the third printed circuit board. The second signal transmission film, the second driving film, and the third signal transmission film may be configured to connect the display panel and the second printed circuit board, and the third driving film and the fourth signal transmission film may be configured to connect the display panel and the third printed circuit board. The third portion of the second printed circuit board and the second portion of the third printed circuit board may be between the first portion of the second printed circuit board and the first portion of the third printed circuit board.

In example embodiments, the third signal transmission film and the fourth signal transmission film may be between the second driving film and the third driving film.

In example embodiments, the display device may further include second connection electrodes in the pad region corresponding to a portion where the third signal transmission film and the fourth signal transmission film are in the pad region of the display panel. A first side of the second connection electrodes (e.g., a first side of each second connection electrode of a plurality of second connection electrodes) may be coupled to the third signal transmission film, and a second side of the second connection electrodes (e.g., a second side of each second connection electrode of the plurality of second connection electrodes) may be coupled to the fourth signal transmission film.

In example embodiments, each of the third signal transmission film and the fourth signal transmission film may not include a driving integrated circuit, and the third printed circuit board may not include a driving controller.

In example embodiments, the driving controller may be configured to generate a first signal, a second signal, and a third signal, and the first signal may be provided to the display panel through the first driving film. The second signal and the third signal may be provided to the second printed circuit board through the first signal transmission film and the second signal transmission film, and may be provided to the display panel through the second driving film. The third signal may be provided to the display panel through the third driving film after the third signal is transferred to the third printed circuit board through the third signal transmission film and the fourth signal transmission film.

In example embodiments, the display device may further include a third printed circuit board, a fourth printed circuit board, a third driving film, a fourth driving film, a third signal transmission film, and a fourth signal transmission film. The third printed circuit board may be adjacent to the second printed circuit board, and may include a second driving controller configured to generate a plurality of signals. The fourth printed circuit board may be adjacent to the third printed circuit board. The third driving film may be electrically connected to the third printed circuit board, and may include a third driving integrated circuit. The fourth driving film may be electrically connected to the fourth printed circuit board, and may include a fourth driving integrated circuit. The third signal transmission film may be electrically connected to the third printed circuit board, and may include third signal transmission wirings. The fourth signal transmission film may be electrically connected to the fourth printed circuit board and the third signal transmission film, and may include fourth signal transmission wirings.

In example embodiments, the third driving film may be in a first portion of the third printed circuit board, and the third signal transmission film may be in a second portion different from the first portion of the third printed circuit board. The fourth driving film may be in a first portion of the fourth printed circuit board, and the fourth signal transmission film may be in a second portion different from the first portion of the third printed circuit board. The third driving film and the third signal transmission film may be configured to connect the display panel and the third printed circuit board, and the fourth driving film and the fourth signal transmission film may be configured to connect the display panel and the fourth printed circuit board. The third signal transmission film and the fourth signal transmission film may be between the third driving film and the fourth driving film.

In example embodiments, the display device may further include second connection electrodes in the pad region corresponding to a portion where the third signal transmission film and the fourth signal transmission film are in the pad region of the display panel. A first side of the second connection electrodes (e.g., a first side of each second connection electrode of a plurality of second connection electrodes) may be coupled to in the third signal transmission film, and a second side of the second connection electrodes (e.g., a second side of each second connection electrode of the plurality of second connection electrodes) may be coupled to the fourth signal transmission film.

In example embodiments, each of the third signal transmission film and the fourth signal transmission film may not include a driving integrated circuit, and the fourth printed circuit board may not include a driving controller.

In example embodiments, the first driving controller may be configured to generate a first signal and a second signal, and the first signal may be provided to the display panel through the first driving film. The second signal may be provided to the display device through the second driving film after the second signal is transferred to the second printed circuit board through the first signal transmission film and the second signal transmission film. The second driving controller may be configured to generate a third signal and a fourth signal, and the third signal may be provided to the display device through the third driving film. The fourth signal may be provided to the display panel through the fourth driving film after the fourth signal is transferred to the fourth printed circuit board through the third signal transmission film and the fourth signal transmission film.

In example embodiments, after the first driving film, the second driving film, the first signal transmission film, and the second signal transmission film are bent, and the first printed circuit board and the second printed circuit board may be on a bottom surface of the display panel.

As the display device according to example embodiments includes the first signal transmission film, the second signal transmission film, and the first connection electrodes, the second signal generated from the first driving controller of the first printed circuit board may be transferred to the second printed circuit board through the first signal transmission film, the second signal transmission film, and the first connection electrodes without a connection cable that connects the first printed circuit board and the second printed circuit board. Accordingly, the display device may not generate a failure by (e.g., due to breakage in) the connection cable, and a manufacture cost of the display device may be relatively reduced.

BRIEF DESCRIPTION OF THE DRAWINGS

Example embodiments can be understood in more detail from the following description taken in conjunction with the accompanying drawings, in which:

FIG. 6A is a cross-sectional view for describing a pixel included in the display device of FIG. 1;

DETAILED DESCRIPTION

Hereinafter, embodiments of the present inventive concept will be explained in more detail with reference to the accompanying drawings.

Figure 1:
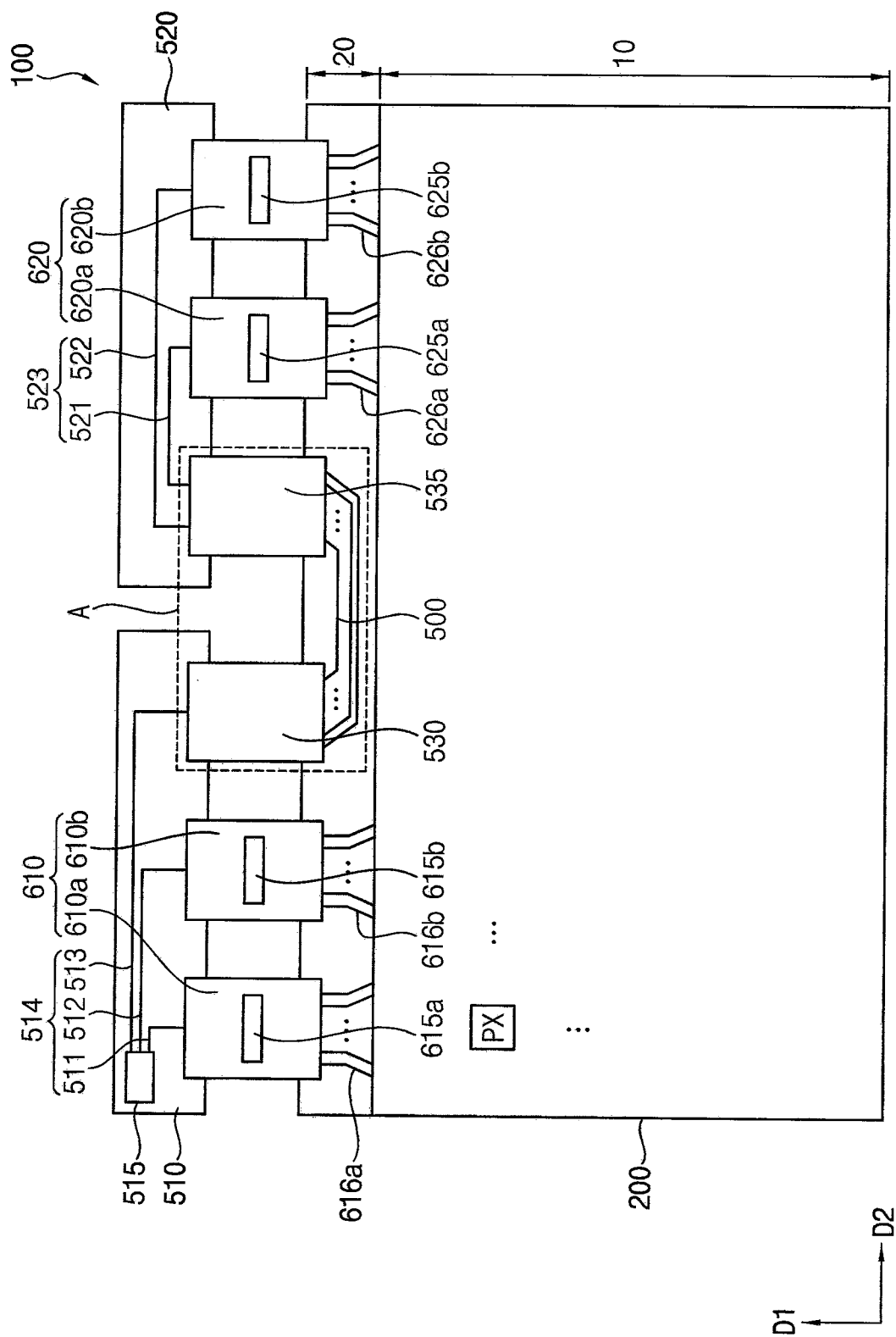
FIG. 1 is a plan view illustrating a display device in accordance with example embodiments.
Figure 2:
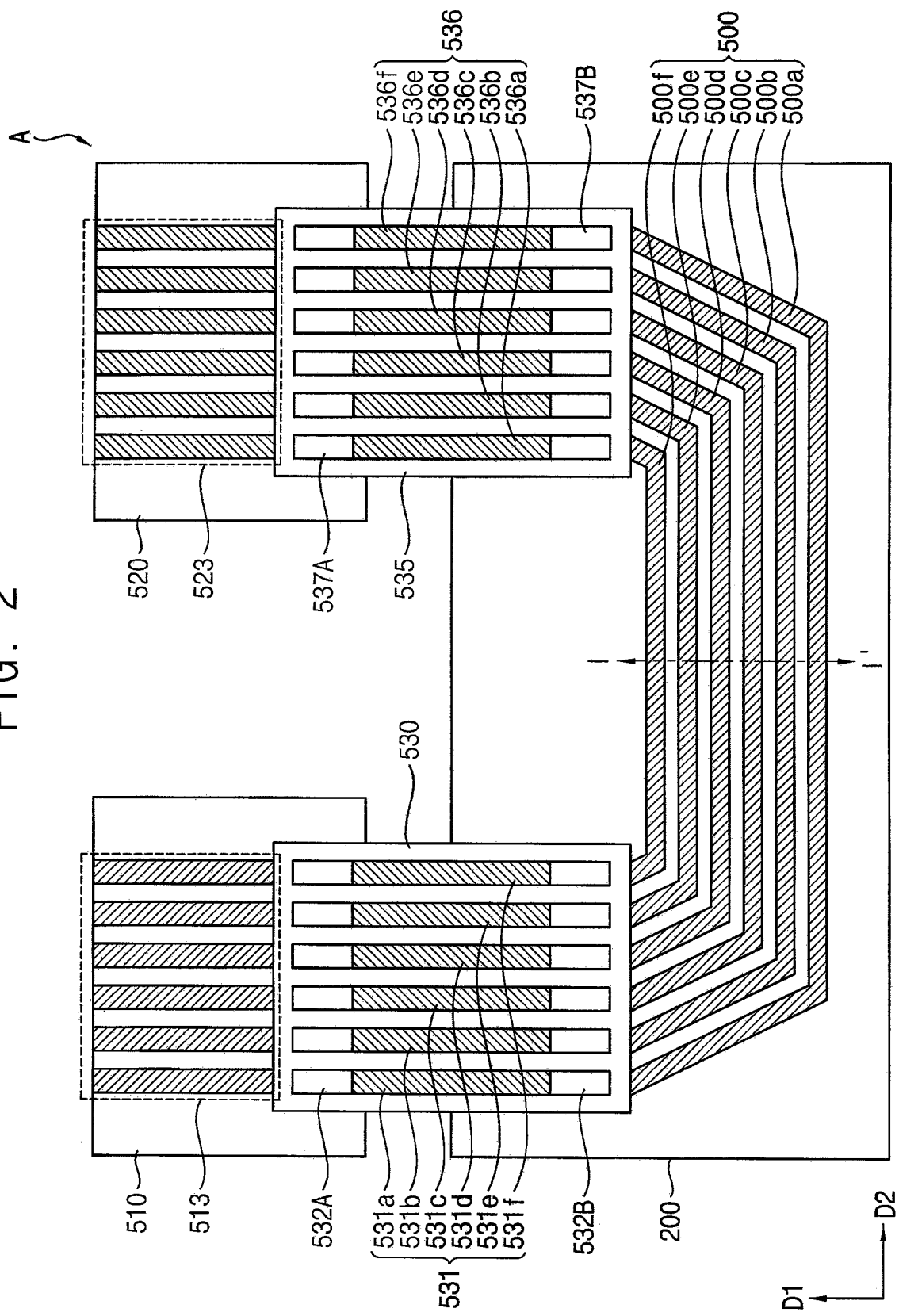
FIG. 2 is an enlarged plan view corresponding to region 'A' of the display device of FIG. 1.

FIG. 1 is a plan view illustrating a display device in accordance with example embodiments, and FIG. 2 is an enlarged plan view corresponding to region 'A' of the display device of FIG. 1.

Referring to FIGS. 1 and 2, a display device 100 may include a display panel 200, a first printed circuit board 510, a second printed circuit board 520, first driving films 610, second driving films 620, a first signal transmission film 530, a second signal transmission film 535, first connection electrodes 500, etc. Here, the first printed circuit board 510 may include a first driving controller 515, and the first driving controller 515 may generate a first signal and a second signal. In addition, the display panel 200 may have a display region 10 and a pad region 20 that is located at a side of the display region 10, and a plurality of pixels PX may be disposed in the display region 10. Further, the first driving films 610 may include a first driving film 610a including a first driving integrated circuit 615a and a first driving film 610b including a first driving integrated circuit 615b, and the second driving films 620 may include a second driving film 620a including a second driving integrated circuit 625a and a second driving film 620b including a second driving integrated circuit 625b. In example embodiments, the second printed circuit board 520 may not include a driving controller, and each of the first signal transmission film 530 and the second signal transmission film 535 may not include a driving integrated circuit. In addition, the first connection electrodes 500 may electrically connect (or may be in direct contact with) the first signal transmission film 530 and the second signal transmission film 535.

An image may be displayed in the display region 10 through the pixels PX of the display panel 200. Wirings (e.g., scan wirings, data wirings, power supply voltage wirings, etc.) may be disposed in the pad region 20. Here, the wirings may be electrically connected to the pixels PX. In example embodiments, as the display device 100 includes the first signal transmission film 530, the second signal transmission film 535, and the first connection electrodes 500, the second signal generated from the first driving controller 515 of the first printed circuit board 510 may be provided to the second printed circuit board 520 through the first signal transmission film 530, the second signal transmission film 535, and the first connection electrodes 500 without a connection cable connecting the first printed circuit board 510 and the second printed circuit board 520.

The first printed circuit board 510 may be located spaced apart from the pad region 20 of the display panel 200 in a first direction D1, and the first printed circuit board 510 may include first wirings 514 and the first driving controller 515 capable of generating a plurality of signals. For example, the signals may be scan signals, data signals, power supply voltages, etc., so as to drive the pixels PX. The first printed circuit board 510 may include a wiring 511 connecting the first driving controller 515 and the first driving film 610a, a wiring 512 connecting the first driving controller 515 and the first driving film 610b, and a wiring 513 connecting the first driving controller 515 and the first signal transmission film 530 such that the first driving controller 515 transfers the signals to the first driving films 610 and the first signal transmission film 530 in the first printed circuit board 510. In addition, the first printed circuit board 510 may further include pads, and the pads may be disposed in a portion where the first printed circuit board 510 overlaps the first driving films 610 and the first signal transmission film 530. The first printed circuit board 510 may be electrically connected to the first driving films 610 and the first signal transmission film 530 through the pads. For example, the first printed circuit board 510 may include a rigid printed circuit board including a driving controller, a plurality of wirings, and pads.

In example embodiments, the first driving controller 515 may generate the first signal and the second signal, and the first signal and the second signal may be data signals. For example, the first signal may be transferred to the first driving films 610, and the second signal may be transferred to the first signal transmission film 530. Here, the first signal may be transferred to the first driving films 610 through the wirings 511 and 512 and the pads of the first printed circuit board 510, and the second signal may be transferred to the second driving films 620 through the second signal transmission film 535 and the second printed circuit board 520 after the second signal is transferred to the first signal transmission film 530 through the wiring 513 and the pads of the first printed circuit board 510.

In example embodiments, each of the wirings 511, 512, and 513 included in the first printed circuit board 510 of FIG. 1 includes one wiring, but embodiments of the present disclosure are not limited thereto. For example, each of the wirings 511, 512, and 513 may include a plurality of wirings.

The second printed circuit board 520 may be located spaced apart from the pad region 20 of the display panel 200 in the first direction D1, and may be located spaced apart from the first printed circuit board 510 in a second direction D2 that is crossing or perpendicular to the first direction D1. In other words, the first printed circuit board 510 and the second printed circuit board 520 may be located adjacent to each other, and may be located substantially parallel to the pad region 20.

In example embodiments, the second printed circuit board 520 may serve as a printed circuit board without a driving controller. The second printed circuit board 520 may receive the second signal generated from the first driving controller 515 of the first printed circuit board 510 through the second signal transmission film 535, and the second printed circuit board 520 may include a wiring 523 connecting the second signal transmission film 535 and the second driving films 620 such that the second signal is transferred to the second driving films 620. For example, the second printed circuit board 520 may include a wiring 521 connecting the second signal transmission film 535 and the second driving film 620a and a wiring 522 connecting the second signal transmission film 535 and the second driving film 620b such that the second signal provided in the second signal transmission film 535 is transferred to the second driving film 620a and the second driving film 620b in the second printed circuit board 520. In addition, the second printed circuit board 520 may further include pads, and the pads may be disposed in a portion where the second printed circuit board 520 overlaps the second signal transmission film 535 and the second driving films 620. The second signal transmission film 535 may be electrically connected to the second driving films 620 through the pads. In other words, the second signal provided in the second signal transmission film 535 may be transferred to the second driving films 620 through the wirings 521 and 522 and the pads of the second printed circuit board 520. For example, the second printed circuit board 520 may include a rigid printed circuit board including a plurality of wirings and pads.

In example embodiments, each of the wirings 521 and 522 included in the second printed circuit board 520 of FIG. 1 includes one wiring, but embodiments of the present disclosure are not limited thereto. For example, each of the wirings 521 and 522 may include a plurality of wirings.

The first driving films 610 may be located in a first portion of the first printed circuit board 510, and may include driving integrated circuits, respectively. For example, the first driving film 610a including the first driving integrated circuit 615a may be located on a left side of the first printed circuit board 510. Here, the first driving integrated circuit 615a may be mounted on the first driving film 610a by a chip on film method. A first side (e.g., a top portion) of the first driving film 610a may overlap with the first printed circuit board 510, and a second side (e.g., a bottom portion) of the first driving film 610a may overlap with the pad region 20 of the display panel 200. Here, the first side may be opposite to the second side. The first driving film 610a may further include wirings and pads, and the first driving film 610a may be electrically connected to the first printed circuit board 510 and the display panel 200 through the wirings and the pads.

First data wirings 616a may be disposed in the pad region 20 of the display panel 200. For example, the first data wirings 616a may be disposed in the pad region 20 corresponding to a portion where the first driving film 610a is located in the pad region 20. The first data wirings 616a may include a plurality of electrodes. A first side of the first data wirings 616a may be coupled to (or connected to) the pads of the first driving film 610a, and a second side of the first data wirings 616a may be coupled to the pixels PX.

As described above, the first driving film 610a may receive the first signal from the first driving controller 515 through the wiring 511 of the first printed circuit board 510, and may provide (or transfer) the first signal to the pixels PX of the display panel 200 through the wirings and the pads of the first driving film 610a and the first data wirings 616a.

In addition, the first driving film 610b including the first driving integrated circuit 615b may be located in a center of the first printed circuit board 510. Here, the first driving integrated circuit 615b may be mounted on the first driving film 610b by a chip on film method. A first side of the first driving film 610b may overlap with the first printed circuit board 510, and a second side of the first driving film 610b may overlap with the pad region 20 of the display panel 200. Here, the first side may be opposite to the second side. The first driving film 610b may further include wirings and pads, and may be electrically connected to the first printed circuit board 510 and the display panel 200 through the wirings and the pads.

Second data wirings 616b may be disposed in the pad region 20 of the display panel 200. For example, the second data wirings 616b may be disposed in the pad region 20 corresponding to a portion where the first driving film 610b is located in the pad region 20. The second data wirings 616b may include a plurality of electrodes. A first side of the second data wirings 616b may be coupled to the pads of the first driving film 610b, and a second side of the second data wirings 616b may be coupled to the pixels PX.

As described above, the first driving film 610b may receive the first signal from the first driving controller 515 through the wiring 512 of the first printed circuit board 510, and may provide the first signal to the pixels PX of the display panel 200 through the wirings and the pads of the first driving film 610b and the second data wirings 616b. For example, the first driving films 610 may include a flexible printed circuit board or flexible flat cable, etc.

The first signal transmission film 530 may be located in a second portion of the first printed circuit board 510, and the first portion may be different from the second portion. In other words, the first signal transmission film 530 may be located on a right side of the first printed circuit board 510, and the first driving film 610a, the first driving film 610b, and the first signal transmission film 530 may be sequentially arranged along the second direction D2 on the first printed circuit board 510. In example embodiments, the first signal transmission film 530 may serve as a signal transmission film without a driving integrated circuit. A first side of the first signal transmission film 530 may overlap with the first printed circuit board 510, and a second side of the first signal transmission film 530 may overlap with the pad region 20 of the display panel 200. Here, the first side may be opposite to the second side.

As illustrated in FIG. 2, in example embodiments, the first signal transmission film 530 may include a plurality of signal transmission wirings 531 and pads 532A and 532B.

Here, the signal transmission wirings 531 may include a first signal transmission wiring 531a, a first signal transmission wiring 531b, a first signal transmission wiring 531c, a first signal transmission wiring 531d, a first signal transmission wiring 531e, and first signal transmission wirings 531f. The first signal transmission film 530 may be electrically connected to the first printed circuit board 510 and the first connection electrodes 500 through the signal transmission wirings 531 and the pads 532A and 532B. For example, the wiring 513 of the first printed circuit board 510 may be coupled to the pads 532A of the first signal transmission film 530, and a first side of the first connection electrodes 500 may be coupled to the pads 532B of the first signal transmission film 530. As described above, the first signal transmission film 530 may receive the second signal from the first driving controller 515 through the wiring 513 of the first printed circuit board 510, and may provide the second signal to the first connection electrodes 500 through the signal transmission wirings 531 and the pads 532A and 532B of the first signal transmission film 530: For example, the first signal transmission film 530 may not include a driving integrated circuit, and may include a flexible printed circuit board or a flexible flat cable, etc., that primarily includes only wirings and pads.

Referring again to FIGS. 1 and 2, the second driving films 620 may be located in a first portion of the second printed circuit board 520, and may include driving integrated circuits, respectively. For example, the second driving film 620a including the second driving integrated circuit 625a may be located in a center of the second printed circuit board 520. Here, the second driving integrated circuit 625a may be mounted on the second driving film 620a by a chip on film method. A first side of the second driving film 620a may overlap with the second printed circuit board 520, and a second side of the second driving film 620a may overlap with the pad region 20 of the display panel 200. Here, the first side may be opposite to the second side. The second driving film 620a may further include wirings and pads, and may be electrically connected to the second printed circuit board 520 and the display panel 200 through the wirings and the pads.

Third data wirings 626a may be disposed in the pad region 20 of the display panel 200. For example, the third data wirings 626a may be disposed in the pad region 20 corresponding to a portion where the second driving film 620a is located in the pad region 20. The third data wirings 626a may include a plurality of electrodes. A first side of the third data wirings 626a may be coupled to the pads of the second driving film 620a, and a second side of the third data wirings 626a may be coupled to the pixels PX.

As described above, the second driving film 620a may receive the second signal from the first driving controller 515 through the wiring 521 of the second printed circuit board 520, and may provide the second signal to the pixels PX of the display panel 200 through the wirings and the pads of the second driving film 620a and the third data wirings 626a.

In addition, the second driving film 620b including the second driving integrated circuit 625b may be located on a right side of the second printed circuit board 520. Here, the second driving integrated circuit 625b may be mounted on the second driving film 620b by a chip on film method. A first side of the second driving film 620b may overlap with the second printed circuit board 520, and a second side of the second driving film 620b may overlap with the pad region 20 of the display panel 200. Here, the first side may be opposite to the second side. The second driving film 620b may further include wirings and pads, and may be electrically connected to the second printed circuit board 520 and the display panel 200 through the wirings and the pads.

Fourth data wirings 626b may be disposed in the pad region 20 of the display panel 200. For example, the fourth data wirings 626b may be disposed in the pad region 20 corresponding to a portion where the second driving film 620b is located in the pad region 20. The fourth data wirings 626b may include a plurality of electrodes. A first side of the fourth data wirings 626b may be coupled to the pads of the second driving film 620b, and a second side of the fourth data wirings 626b may be coupled to the pixels PX.

As described above, the second driving film 620b may receive the second signal from the first driving controller 515 through the wiring 522 of the second printed circuit board 520, and may provide the second signal to the pixels PX of the display panel 200 through the wirings and the pads of the second driving film 620b and the fourth data wirings 626b. For example, the second driving films 620 may include a flexible printed circuit board or flexible flat cable, etc.

For example, the first, second, third, and fourth data wirings 616a, 616b, 626a, and 626b may include first through (M)th electrodes, and a plurality of pixels PX may include first through (N)th pixel column groups that define the pixels PX arranged in a same column. Here, M is an integer greater than 1, and N is an integer greater than 1. A (K)th electrode among the first through (M)th electrodes may be electrically connected to a (J)th pixel column group among the first through (N)th pixel column groups. Here, K is an integer between 1 and M, and J is an integer between 1 and N.

The second signal transmission film 535 may be located in a second portion of the second printed circuit board 520, and the first portion may be different from the second portion. In example embodiments, the second portion of the first printed circuit board 510 and the second portion of the second printed circuit board 520 may be located between the first portion of the first printed circuit board 510 and the first portion of the second printed circuit board 520, and the first signal transmission film 530 and the second signal transmission film 535 may be located between the first driving films 610 and the second driving films 620. That is, the first signal transmission film 530 may be located adjacent to the second signal transmission film 535.

In other words, the second signal transmission film 535 may be located on a left side of the second printed circuit board 520, and the second signal transmission film 535, the second driving film 620a, and the second driving film 620b may be sequentially arranged along the second direction D2 on the second printed circuit board 520. In example embodiments, the second signal transmission film 535 may serve as a signal transmission film without a driving integrated circuit. A first side of the second signal transmission film 535 may overlap with the second printed circuit board 520, and a second side of the second signal transmission film 535 may overlap with the pad region 20 of the display panel 200. Here, the first side may be opposite to the second side.

As illustrated in FIG. 2, in example embodiments, the second signal transmission film 535 may include a plurality of signal transmission wirings 536 and pads 537A and 537B. Here, the signal transmission wirings 536 may include a second signal transmission wiring 536a, a second signal transmission wiring 536b, a second signal transmission wiring 536c, a second signal transmission wiring 536d, a second signal transmission wiring 536e, and a second signal transmission wiring 536f. The second signal transmission film 535 may be electrically connected to the second printed circuit board 520 and the first connection electrodes 500 through the signal transmission wirings 536 and the pads 537A and 537B. For example, the wiring 523 of the second printed circuit board 520 may be coupled to the pads 537A of the second signal transmission film 535, and a second side of the first connection electrodes 500 may be coupled to the pads 537B of the second signal transmission film 535. As described above, the second signal transmission film 535 may receive the second signal of the first driving controller 515 provided to the first connection electrodes 500 through the signal transmission wirings 536 and the pads 537A and 537B, and the wiring 513 of the first printed circuit board 510, and may provide the second signal to the second driving films 620 through the wiring 523 of the second signal transmission film 535. For example, the second signal transmission film 535 may not include a driving integrated circuit, and may include a flexible printed circuit board or a flexible flat cable, etc., that primarily includes wirings and pads.

Referring again to FIGS. 1 and 2, the first connection electrodes 500 may be disposed in the pad region 20 of the display panel 200. For example, the first connection electrodes 500 may be disposed in the pad region 20 corresponding to a portion where the first signal transmission film 530 and the second signal transmission film 535 are located in the pad region 20. The first connection electrodes 500 may include a plurality of electrodes 500a, 500b, 500c, 500d, 500e, and 500f. As described above, a first side of the first connection electrodes 500 may be coupled to the first signal transmission film 530, and a second side of the first connection electrodes 500 may be coupled to the second signal transmission film 535. Accordingly, the second signal generated from the first driving controller 515 may be transferred to the second printed circuit board 520 through the first signal transmission film 530, the first connection electrodes 500, and the second signal transmission film 535 without a connection cable connecting the first printed circuit board 510 and the second printed circuit board 520, and the second signal may be provided to the display panel 200 through the second driving films 620.

In example embodiments, a printed circuit board is coupled to two driving films and one signal transmission film, but embodiments of the present disclosure are not limited thereto. For example, the printed circuit board may be coupled to one driving film and one signal transmission film, or is coupled to at least three driving films and one signal transmission film.

In addition, the first driving films 610, the first signal transmission film 530, the second signal transmission film 535, and the second driving films 620 are sequentially arranged, but embodiments of the present disclosure are not limited thereto. For example, a sequence of the first driving film 610a, the first driving film 610b, and the first signal transmission film 530 may be changed on the first printed circuit board 510, and a sequence of the second driving film 620a, the second driving film 620b, the and second signal transmission film 535 may be changed on the second printed circuit board 520. In addition, the first signal transmission film 530 and the second signal transmission film 535 may be coupled to the first connection electrodes 500.

Figure 3:
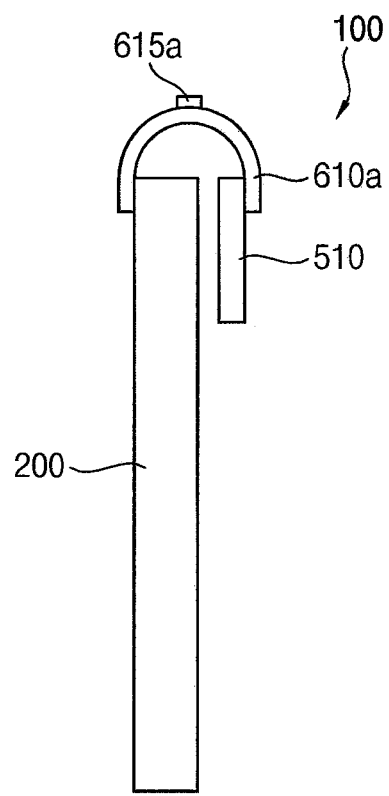
FIG. 3 is a cross-sectional view illustrating a bent shape of a driving film included in the display device of FIG. 1.
Figure 4:
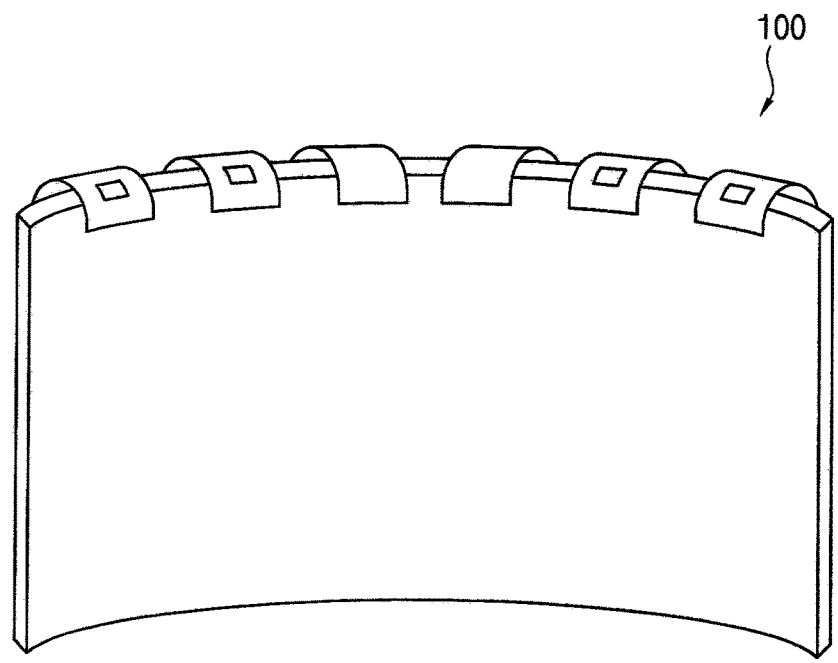
FIGS. 4 and 5 are each a perspective view illustrating the display device of FIG. 1.
Figure 5:
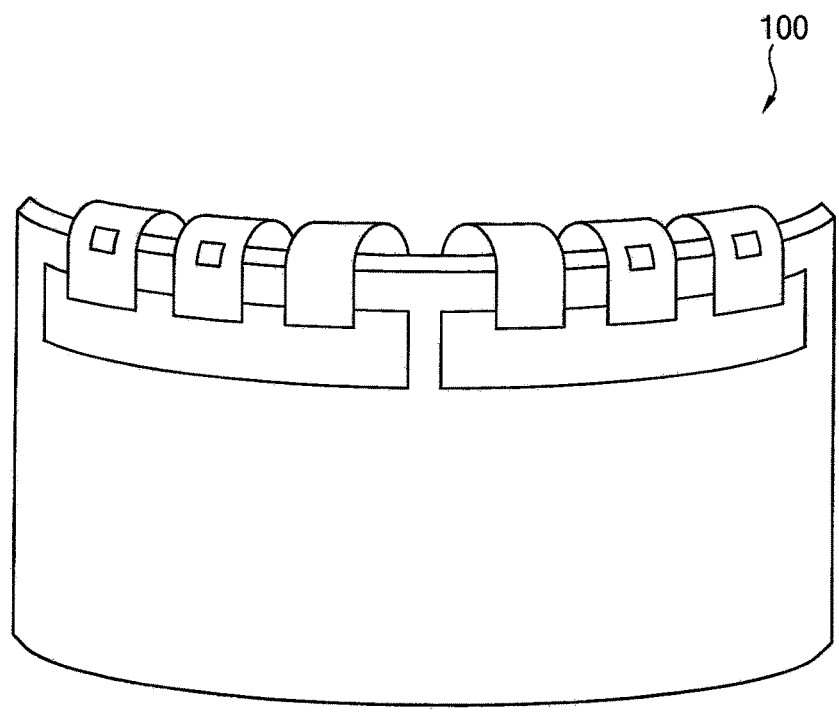

FIG. 3 is a cross-sectional view illustrating a bent shape of a driving film included in the display device of FIG. 1, and FIGS. 4 and 5 are a perspective view illustrating the display device of FIG. 1.

Referring to FIGS. 3, 4, and 5, the first driving films 610, the first signal transmission film 530, the second signal transmission film 535, and the second driving films 620 may be bent along an axis with respect to the second direction D2, and the first printed circuit board 510 and the second printed circuit board 520 may be located on a bottom surface (e.g., the display panel 200 may be displayed in a top surface that is opposite to the bottom surface) of the display panel 200. As illustrated in FIGS. 4 and 5, the display panel 200 may have a rounded shape (or a curved shape). For example, FIG. 4 may illustrate the top surface (e.g., a surface where an image is displayed) of the display panel 200 included in the display device 100, and FIG. 5 may illustrate the bottom surface (e.g., a surface where an image is not displayed and opposite to the first surface) of the display panel 200 included in the display device 100.

For example, when a conventional display device having a curved shape and including a connection cable that connects a first printed circuit board and a second printed circuit board is bent by a first driving film and a second driving film, a distance between the first printed circuit board and the second printed circuit board may be increased. In this case, the connection cable may be broken (or cut). To prevent this, when a connection cable having a relatively increased distance is utilized, a manufactured cost of the conventional display device may be increased. In addition, after the conventional display device is bent, a relatively increased space may be required to dispose the connection cable having a relatively increased distance in the bottom surface of the conventional display device.

As the display device 100 according to example embodiments includes the first signal transmission film 530, the second signal transmission film 535, and the first connection electrodes 500, the second signal generated from the first driving controller 515 of the first printed circuit board 510 may be transferred to the second printed circuit board 520 through the first signal transmission film 530, the second signal transmission film 535, and the first connection electrodes 500 without a connection cable that connects the first printed circuit board 510 and the second printed circuit board 520. Accordingly, the display device 100 may not generate a failure by (e.g., due to breakage of) the connection cable, and a manufacture cost of the display device 100 may be relatively reduced.

In example embodiments, the display panel 200 has a curved shape, but embodiments of the present disclosure are not limited thereto. For example, the display panel 200 may include a flat display panel where a surface capable of displaying an image is flat.

Figure 6B:
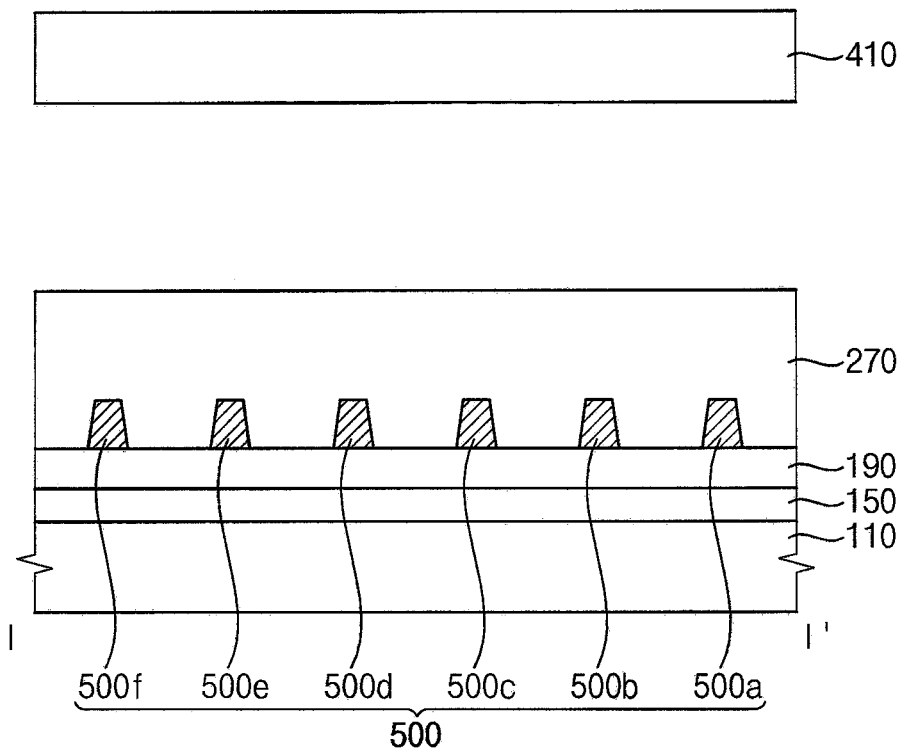
FIG. 6B is a cross-sectional view taken along the line I-I' of FIG. 2.

FIG. 6A is a cross-sectional view for describing a pixel included in the display device of FIG. 1, and FIG. 6B is a cross-sectional view taken along the line I-I' of FIG. 2.

Referring to FIG. 6A, each of the pixels PX of the display panel 200 may be configured as follows. For example, the display panel 200 may include a substrate 110, a semiconductor element 250, a planarization layer 270, a pixel defining layer 310, a pixel structure 300, and an encapsulation substrate 410. In addition, the semiconductor element 250 may include an active layer 130, a gate insulation layer 150, a gate electrode 170, an insulating interlayer 190, a source electrode 210, and a drain electrode 230, and the pixel structure 300 may include a lower electrode 290, a light emitting layer 330, and an upper electrode 340.

The substrate 110 may be provided. The substrate 110 may include transparent or opaque materials. The substrate 110 may include a quartz substrate, a synthetic quartz substrate, a calcium fluoride substrate, a fluoride-doped quartz substrate, a soda lime glass substrate, a non-alkali glass substrate etc. Alternatively, the substrate 110 may include a flexible transparent material such as a flexible transparent resin substrate (e.g., a polyimide substrate). For example, the polyimide substrate may include a first polyimide layer, a first barrier film layer, a second polyimide layer, a second barrier film layer, etc. Because the polyimide substrate is relatively thin and flexible, the polyimide substrate may be formed on a rigid glass substrate to help support the formation of the semiconductor element 250 and the pixel structure 300. That is, the substrate 110 may have a structure in which the first polyimide layer, the first barrier film layer, the second polyimide layer, and the second barrier film layer are stacked on the rigid glass substrate. In manufacturing the OLED device, after an insulation layer (e.g., a buffer layer) is provided on the second polyimide layer of the polyimide substrate, the semiconductor element 250 and the pixel structure 300 may be formed on the buffer layer. After the semiconductor element 250 and the pixel structure 300 are formed on the buffer layer, the rigid glass substrate on which the polyimide substrate is formed may be removed. It may be difficult to directly form the semiconductor element 250 and the pixel structure 300 on the polyimide substrate because the polyimide substrate is relatively thin and flexible. Accordingly, the semiconductor element 250 and the pixel structure 300 are formed on the polyimide substrate and the rigid glass substrate, and then the polyimide substrate may serve as the substrate 110 after the removal of the rigid glass substrate.

A buffer layer may be disposed on the substrate 110. The buffer layer may be disposed on the entire substrate 110. The buffer layer may prevent or reduce the diffusion of metal atoms and/or impurities from the substrate 110 into the semiconductor element 250 and the pixel structure 300. In addition, the buffer layer may control a rate of a heat transfer in a crystallization process for forming the active layer 130, thereby obtaining a substantially uniform active layer 130. Further, the buffer layer may improve a surface flatness of the substrate 110 when a surface of the substrate 110 is relatively irregular. According to a type of (e.g., according to the material used to form) the substrate 110, at least two buffer layers may be provided on the substrate 110, or the buffer layer may not be disposed. For example, the buffer layer may include silicon compound, metal oxide, etc.

The active layer 130 may be disposed on the substrate 110. For example, the active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130, and may be disposed on the substrate 110. For example, the gate insulation layer 150 may sufficiently cover the active layer 130 on the substrate 110, and may have a substantially flat upper surface without a step around the active layer 130. Alternatively, the gate insulation layer 150 may cover the active layer 130 on the substrate 110, and may be disposed with a substantially uniform thickness along a profile of the active layer 130. The gate insulation layer 150 may include silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on a portion of the gate insulation layer 150 under which the active layer 130 is located. The gate electrode 170 may include a metal, a metal alloy, metal nitride, conductive metal oxide, transparent conductive materials, etc. For example, the gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be utilized alone or in a suitable combination thereof. In some example embodiments, the gate electrode 170 may have a multi-layered structure.

The insulating interlayer 190 may be disposed on the gate electrode 170. The insulating interlayer 190 may cover the gate electrode 170, and may be disposed on the gate insulation layer 150. For example, the insulating interlayer 190 may sufficiently cover the gate electrode 170 on the gate insulation layer 150, and may have a substantially flat upper surface without a step around the gate electrode 170. Alternatively, the insulating interlayer 190 may cover the gate electrode 170 on the gate insulation layer 150, and may be disposed as a substantially uniform thickness along a profile of the gate electrode 170. The insulating interlayer 190 may include silicon compound, metal oxide, etc.

The source electrode 210 and the drain electrode 230 may be disposed on the insulating interlayer 190. The source electrode 210 may be in direct contact with a first side (e.g., a source region) of the active layer 130 via a contact hole formed by removing a portion of each of the gate insulation layer 150 and the insulating interlayer 190. The drain electrode 230 may be in direct contact with a second side (e.g., a drain region) of the active layer 130 via a contact hole formed by removing another portion of each of the gate insulation layer 150 and the insulating interlayer 190. The source electrode 210 and the drain electrode 230 may include a metal, an alloy, metal nitride, conductive metal oxide, transparent conductive materials, etc. These may be utilized alone or in a suitable combination thereof. In some example embodiments, each of the source and drain electrodes 210 and 230 may have a multi-layered structure. Accordingly, the semiconductor element 250 including the active layer 130, the gate insulation layer 150, the gate electrode 170, the insulating interlayer 190, the source electrode 210, and the drain electrode 230 may be constituted (e.g., manufactured).

The planarization layer 270 may be disposed on the source electrode 210 and the drain electrode 230. The planarization layer 270 may cover the source electrode 210 and the drain electrode 230. That is, the planarization layer 270 may be disposed on the entire insulating interlayer 190. In example embodiments, the planarization layer 270 may be disposed with a high thickness to sufficiently cover the source and drain electrodes 210 and 230. In this case, the planarization layer 270 may have a substantially flat upper surface, and a planarization process may be further performed on the planarization layer 270 to implement the flatness of the upper surface of the planarization layer 270. Alternatively, the planarization layer 270 may cover the source and drain electrodes 210 and 230, and may be disposed with a substantially uniform thickness along a profile of the source and drain electrodes 210 and 230. The planarization layer 270 may include organic materials or inorganic materials. In example embodiments, the planarization layer 270 may include organic materials. For example, the planarization layer 270 may include a polyimide-based resin, a photoresist, an acryl-based resin, a polyamide-based resin, a siloxane-based resin, etc.

The lower electrode 290 may be disposed on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include a metal, a metal alloy, metal nitride, conductive metal oxide, transparent conductive materials, etc. These may be utilized alone or in a suitable combination thereof. Alternatively, the lower electrode 290 may have a multi-layered structure.

The pixel defining layer 310 may be disposed on the planarization layer 270, and may expose a portion of the lower electrode 290. The pixel defining layer 310 may include organic materials or inorganic materials. In example embodiments, the pixel defining layer 310 may include organic materials.

The light emitting layer 330 may be disposed on the lower electrode 290 exposed by the pixel defining layer 310. The light emitting layer 330 may be formed utilizing at least one of light emitting materials capable of generating different colors of light (e.g., a red color of light, a blue color of light, and a green color of light) according to sub-pixels. Alternatively, the light emitting layer 330 may generally generate light of a white color by stacking a plurality of light emitting materials capable of generating light of different colors, such as a red color light, a green color light, and a blue color light. In this case, a color filter may be disposed on the light emitting layer 330. The color filter may include at least one selected from a red color filter, a green color filter, and a blue color filter. Alternatively, the color filter may include a yellow color filter, a cyan color filter, and a magenta color filter. The color filter may include a photosensitive resin.

The upper electrode 340 may be disposed on the pixel defining layer 310 and the light emitting layer 330. The upper electrode 340 may include a metal, a metal alloy, metal nitride, conductive metal oxide, transparent conductive materials, etc. In some example embodiments, the upper electrode 340 may have a multi-layered structure. Accordingly, the pixel structure 300 including the lower electrode 290, the light emitting layer 330, and the upper electrode 340 may be constituted (e.g., manufactured).

The encapsulation substrate 410 may be disposed on the upper electrode 340. The encapsulation substrate 410 and the substrate 110 may include substantially the same material. For example, the encapsulation substrate 410 may include a quartz substrate, a synthetic quartz substrate, a calcium fluoride substrate, a fluoride-doped quartz substrate, a soda lime glass substrate, a non-alkali glass substrate, etc. In some example embodiments, the encapsulation substrate 410 may include a transparent inorganic material or flexible plastic. For example, the encapsulation substrate 410 may include a flexible transparent resin substrate. In this case, to increase flexibility of the display panel 200, the encapsulation substrate 410 may include a stacked structure where at least one inorganic layer and at least one organic layer are alternately stacked.

In example embodiments, the display panel 200 includes a display panel of an organic light emitting display device, but embodiments of the present disclosure are not limited thereto. For example, the display panel 200 may include liquid crystal display panel, field emission display panel, plasma display panel, electrophoretic display panel, etc.

Referring to FIG. 6B, the first connection electrodes 500 may be disposed in the pad region 20 on the insulating interlayer 190. The first connection electrodes 500 may be spaced apart from each other. The first connection electrodes 500 may include a metal, an alloy, metal nitride, conductive metal oxide, transparent conductive materials, etc. These may be utilized alone or in a suitable combination thereof. In example embodiments, the first connection electrodes 500, the source electrode 210, and the drain electrode 230 may be located at a same layer, and may be simultaneously or concurrently formed.

The planarization layer 270 may be disposed in the pad region 20 on the first connection electrodes 500 and the insulating interlayer 190. The planarization layer 270 may cover the first connection electrodes 500.

Figure 7:
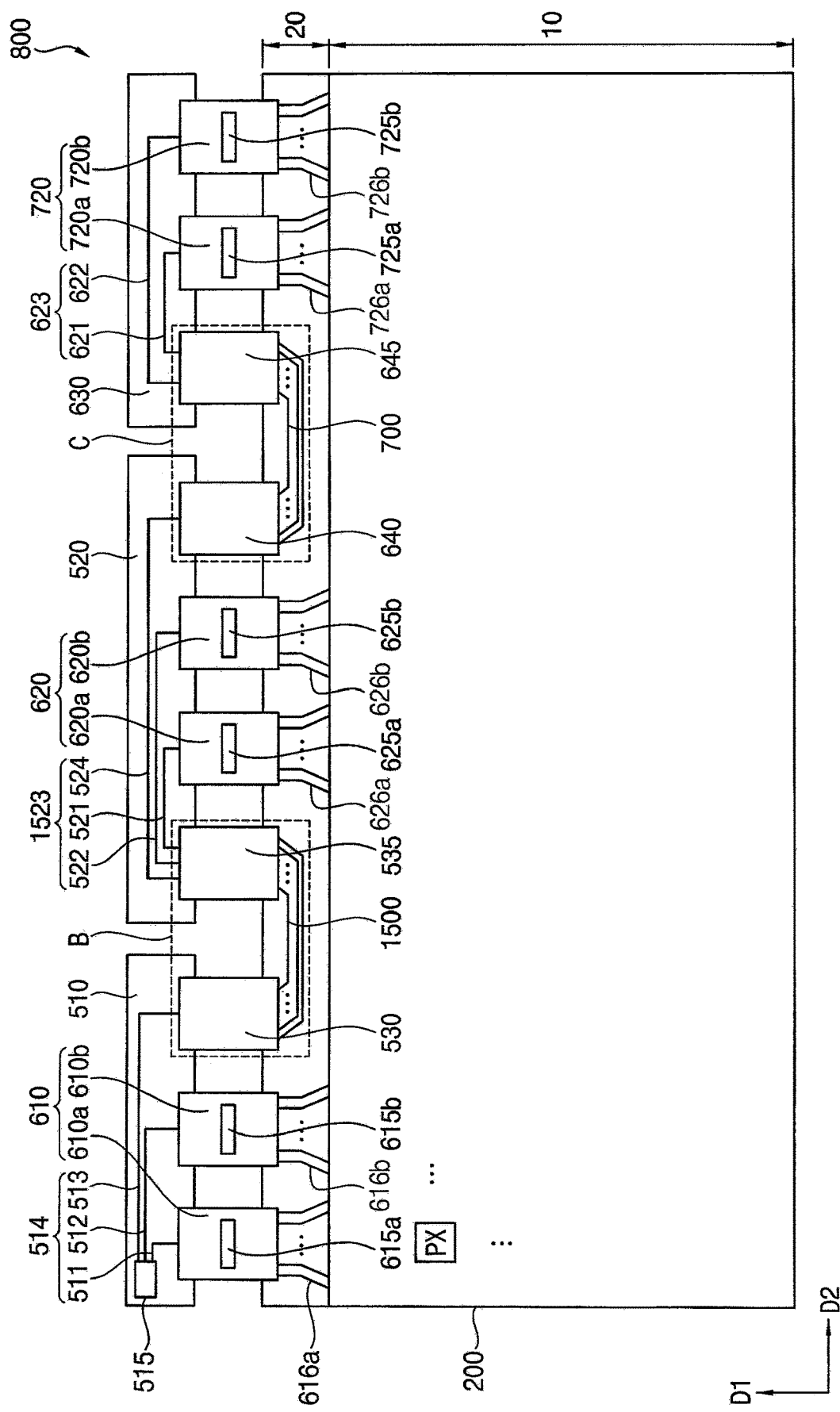
FIG. 7 is a plan view illustrating a display device in accordance with example embodiments.
Figure 8:
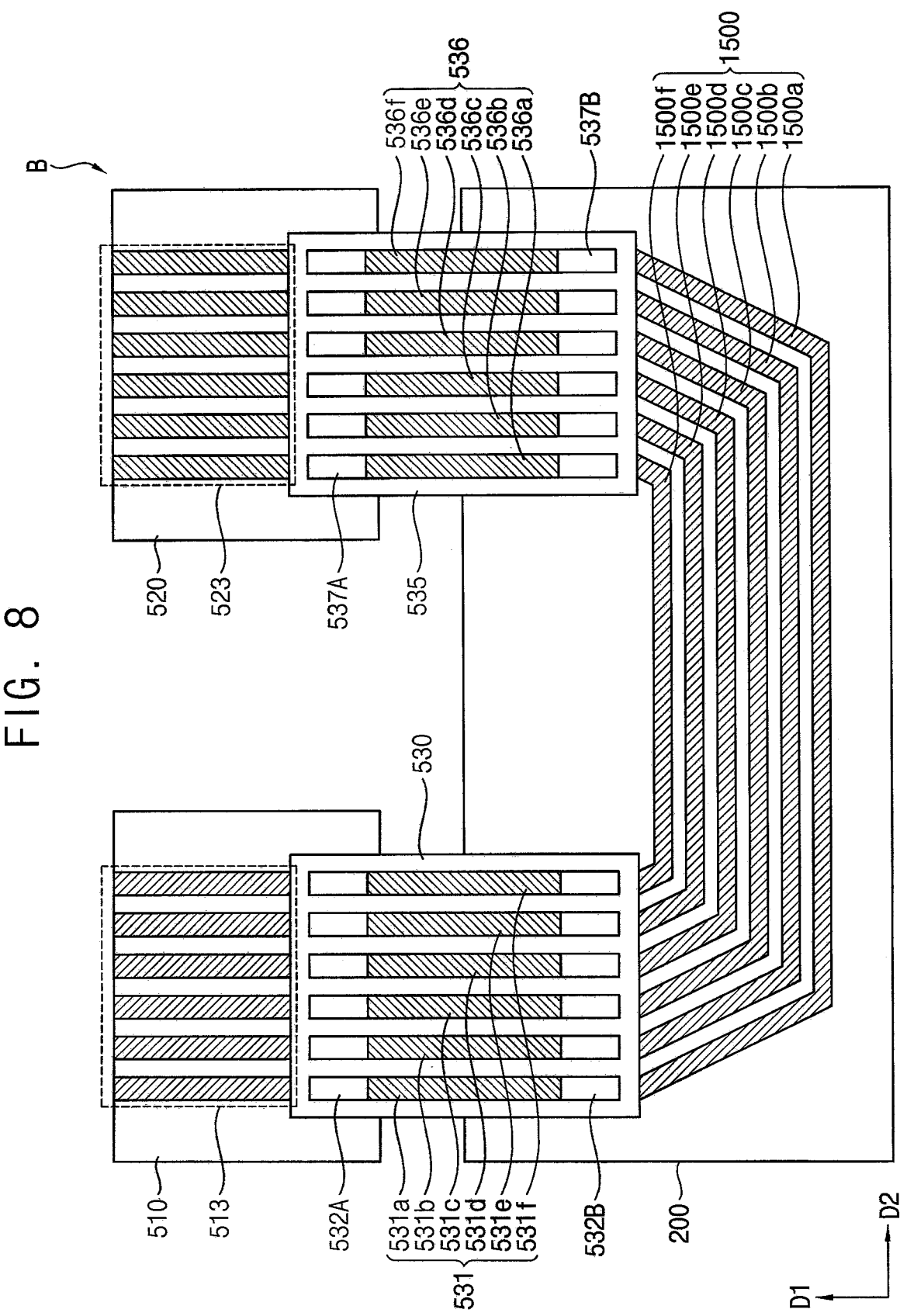
FIG. 8 is an enlarged plan view corresponding to region 'B' of the display device of FIG. 7.
Figure 9:
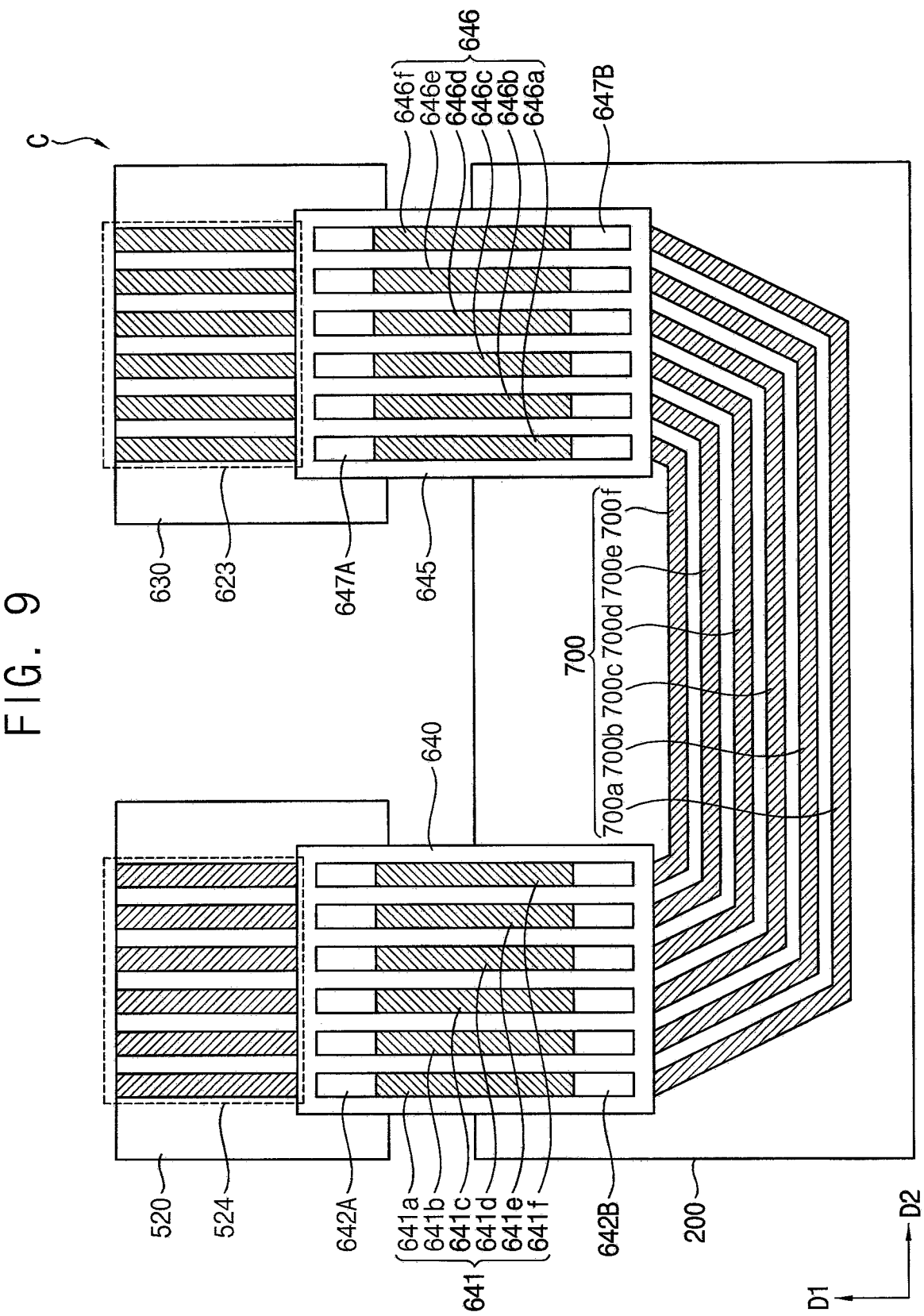
FIG. 9 is an enlarged plan view corresponding to region 'C' of the display device of FIG. 7.

FIG. 7 is a plan view illustrating a display device in accordance with example embodiments, and FIG. 8 is an enlarged plan view corresponding to region 'B' of the display device of FIG. 7. FIG. 9 is an enlarged plan view corresponding to region 'C' of the display device of FIG. 7. A display device 800 illustrated in FIGS. 7 through 9 may have a configuration substantially the same as or similar to that of the display device 100 described with reference to FIGS. 1 through 6B except for a third signal transmission film 640, a fourth signal transmission film 645, a third printed circuit board 630, third driving films 720, first connection electrodes 1500, and second connection electrodes 700. In FIGS. 7 through 9, detailed descriptions for elements that are substantially the same as or similar to elements described with reference to FIGS. 1 through 6B may not be repeated.

Referring to FIGS. 7 through 9, a display device 800 may include a display panel 200, a first printed circuit board 510, a second printed circuit board 520, a third printed circuit board 630, first driving films 610, second driving films 620, third driving films 720, a first signal transmission film 530, a second signal transmission film 535, a third signal transmission film 640, a fourth signal transmission film 645, first connection electrodes 1500, second connection electrodes 700, etc. Here, the first printed circuit board 510 may include a first driving controller 515, and the first driving controller 515 may generate a first signal, a second signal, and a third signal. In addition, the display panel 200 may have a display region 10 and a pad region 20 that is located at a side of the display region 10, and a plurality of pixels PX may be disposed in the display region 10. Further, the first driving films 610 may include a first driving film 610a including a first driving integrated circuit 615a and a first driving film 610b including a first driving integrated circuit 615b, and the second driving films 620 may include a second driving film 620a including a second driving integrated circuit 625a and a second driving film 620b including a second driving integrated circuit 625b. In addition, the third driving films 720 may include a third driving film 720a including a third driving integrated circuit 725a and a third driving film 720b including a third driving integrated circuit 725b. In example embodiments, each of the second printed circuit board 520 and the third printed circuit board 630 may not include a driving controller, and each of the first signal transmission film 530, the second signal transmission film 535, the third signal transmission film 640, and the fourth signal transmission film 645 may not include a driving integrated circuit. In addition, the first connection electrodes 1500 may electrically connect the first signal transmission film 530 and the second signal transmission film 535, and the second connection electrodes 700 may electrically connect (or may be in direct contact with) the third signal transmission film 640 and the fourth signal transmission film 645.

In example embodiments, as the display device 800 includes the first signal transmission film 530, the second signal transmission film 535, the third signal transmission film 640, the fourth signal transmission film 645, the first connection electrodes 1500, and the second connection electrodes 700, each of the second and third signals generated from the first driving controller 515 of the first printed circuit board 510 may be provided to the second printed circuit board 520 and the third printed circuit board 630 through the first signal transmission film 530, the second signal transmission film 535, the third signal transmission film 640, the fourth signal transmission film 645, the first connection electrodes 1500, and the second connection electrodes 700 without a connection cable connecting the first printed circuit board 510, the second printed circuit board 520, and the third printed circuit board 630.

The first driving controller 515 included in the first printed circuit board 510 may generate the first signal, the second signal, and the third signal, and the first signal, the second signal, and the third signal may be data signals. For example, the first signal may be transferred to the first driving films 610, and the second signal may be transferred to the second driving films 620. The third signal may be transferred to the third driving films 720. Here, the first signal may be transferred to the first driving films 610 through the wirings 511 and 512 and the pads of the first printed circuit board 510. The second signal may be transferred to the second driving films 620 through the first connection electrodes 1500, the second signal transmission film 535, and the second printed circuit board 520 after the second signal is transferred to the first signal transmission film 530 through the wiring 513 and the pads of the first printed circuit board 510. The third signal may be transferred to the third driving films 720 through the first connection electrodes 1500, the second signal transmission film 535, the second printed circuit board 520, the third signal transmission film 640, the second connection electrodes 700, the fourth signal transmission film 645, and the third printed circuit board 630 after the third signal is transferred to first signal transmission film 530 through the wiring 513 and the pad of the first printed circuit board 510.

The second printed circuit board 520 may serve as a printed circuit board without a driving controller. The second printed circuit board 520 may receive the second and third signals generated from the first driving controller 515 of the first printed circuit board 510 through the second signal transmission film 535, and may transfer the second signal to the second driving films 620. The second printed circuit board 520 may include a wiring 1523 connecting i) the second signal transmission film 535 and the second driving films 620 and ii) the second signal transmission film 535 and the third signal transmission film 640 such that the third signal is transferred to the third signal transmission film 640. For example, the second printed circuit board 520 may include a wiring 521 connecting the second signal transmission film 535 and the second driving film 620a and a wiring 522 connecting the second signal transmission film 535 and the second driving film 620b such that the second signal provided in the second signal transmission film 535 is transferred to the second driving film 620a and the second driving film 620b in the second printed circuit board 520. In addition, the second printed circuit board 520 may include a wiring 524 connecting the second signal transmission film 535 and the third signal transmission film 640 such that the third signal provided to the second signal transmission film 535 may be transferred to the third signal transmission film 640 in the second printed circuit board 520.

The third printed circuit board 630 may serve as a printed circuit board without a driving controller. The third printed circuit board 630 may receive the third signals generated from the first driving controller 515 of the first printed circuit board 510 through the fourth signal transmission film 645, and the third printed circuit board 630 may include a wiring 623 connecting the fourth signal transmission film 645 and the third driving films 720 such that the third signal is transferred to the third driving films 720. For example, the third printed circuit board 630 may include a wiring 621 connecting the fourth signal transmission film 645 and the third driving film 720a and a wiring 622 connecting the fourth signal transmission film 645 and the third driving film 720b such that the third signal provided to the fourth signal transmission film 645 is transferred to the third driving film 720a and the third driving film 720b in the third printed circuit board 630.

As illustrated in FIG. 8, the first signal transmission film 530 may include a plurality of signal transmission wirings 531 and pads 532A and 532B. Here, the signal transmission wirings 531 may include a first signal transmission wiring 531a, a first signal transmission wiring 531b, a first signal transmission wiring 531c, a first signal transmission wiring 531d, a first signal transmission wiring 531e, and a first signal transmission wiring 531f. The first signal transmission film 530 may be electrically connected to the first printed circuit board 510 and the first connection electrodes 1500 through the signal transmission wirings 531 and the pads 532A and 532B. For example, the wiring 513 of the first printed circuit board 510 may be coupled to the pads 532A of the first signal transmission film 530, and a first side of the first connection electrodes 1500 may be coupled to the pads 532B of the first signal transmission film 530. As described above, the first signal transmission film 530 may receive the second and third signals from the first driving controller 515 through the wiring 513 of the first printed circuit board 510, and may provide the second and third signals to the first connection electrodes 1500 through the signal transmission wirings 531 and the pads 532A and 532B of the first signal transmission film 530. For example, the first signal transmission film 530 may not include a driving integrated circuit, and may include a flexible printed circuit board or a flexible flat cable, etc., that primarily includes only wirings and pads.

Referring again to FIGS. 7 through 9, the second driving films 620 may be located in a first portion (e.g., a center of the second printed circuit board 520) of the second printed circuit board 520, and the second signal transmission film 535 may be located in a second portion (e.g., a left side of the second printed circuit board 520), which is different from the first portion, of the second printed circuit board 520. The third signal transmission film 640 may be located in a third portion (e.g., a right side of the second printed circuit board 520) of the second printed circuit board 520. For example, the first portion may be located between the second and third portions of the second printed circuit board 520.

As illustrated in FIG. 8, the second signal transmission film 535 may include a plurality of signal transmission wirings 536 and pads 537A and 537B. Here, the signal transmission wirings 536 may include a second signal transmission wiring 536a, a second signal transmission wiring 536b, a second signal transmission wiring 536c, a second signal transmission wiring 536d, a second signal transmission wiring 536e, and a second signal transmission wiring 536f. The second signal transmission film 535 may be electrically connected to the second printed circuit board 520 and the first connection electrodes 1500 through the signal transmission wirings 536 and the pads 537A and 537B. For example, the wiring 1523 of the second printed circuit board 520 may be coupled to the pads 537A of the second signal transmission film 535, and a second side of the first connection electrodes 1500 may be coupled to the pads 537B of the second signal transmission film 535. As described above, the second signal transmission film 535 may receive the second and third signals of the first driving controller 515 provided to the first connection electrodes 1500 through the signal transmission wirings 536 and the pads 537A and 537B, and the wiring 513 of the first printed circuit board 510, and may provide the second signal to the second driving films 620 through the wirings 521 and 522 of the second signal transmission film 535. For example, the second signal transmission film 535 may not include a driving integrated circuit, and may include a flexible printed circuit board or a flexible flat cable, etc., that primarily includes only wirings and pads.

Referring again to FIGS. 7 through 9, the first connection electrodes 1500 may be disposed in the pad region 20 of the display panel 200. For example, the first connection electrodes 1500 may be disposed in the pad region 20 corresponding to a portion where the first signal transmission film 530 and the second signal transmission film 535 are located in the pad region 20. The first connection electrodes 1500 may include a plurality of electrodes 1500a, 1500b, 1500c, 1500d, 1500e, and 1500f. As described above, a first side (e.g., a first end) of the first connection electrodes 1500 may be coupled to the first signal transmission film 530, and a second side (e.g., a second end opposite to the first end) of the first connection electrodes 1500 may be coupled to the second signal transmission film 535. Accordingly, the second and third signals generated from the first driving controller 515 may be transferred to the second printed circuit board 520 through the first signal transmission film 530, the first connection electrodes 1500, and the second signal transmission film 535 without a connection cable connecting the first printed circuit board 510 and the second printed circuit board 520, and the second signal may be provided to the display panel 200 through the second driving films 620. The third signal may be provided to the third signal transmission film 640.

As illustrated in FIG. 9, the third signal transmission film 640 may include a plurality of signal transmission wirings 641 and pads 642A and 642B. Here, the signal transmission wirings 641 may include a third signal transmission wiring 641a, a third signal transmission wiring 641b, a third signal transmission wiring 641c, a third signal transmission wiring 641d, a third signal transmission wiring 641e, and a third signal transmission wiring 641f. The third signal transmission film 640 may be electrically connected to the second printed circuit board 520 and the second connection electrodes 700 through the signal transmission wirings 641 and the pads 642A and 642B. For example, the wiring 524 of the second printed circuit board 520 may be coupled to the pads 642A of the third signal transmission film 640, and a first side of the second connection electrodes 700 may be coupled to the pads 642B of the third signal transmission film 640. As described above, the third signal transmission film 640 may receive the third signal from the first driving controller 515 through the wiring 524 of the second printed circuit board 520, and may provide the third signal to the second connection electrodes 700 through the signal transmission wirings 641 and the pads 642A and 642B of the third signal transmission film 640. For example, the third signal transmission film 640 may not include a driving integrated circuit, and may include a flexible printed circuit board or a flexible flat cable, etc., that primarily includes only wirings and pads.

Referring again to FIGS. 7 through 9, the third driving films 720 may be located in a first portion of the third printed circuit board 630, and may include driving integrated circuits, respectively. For example, the third driving film 720a including the third driving integrated circuit 725a may be located in a center of the third printed circuit board 630. Here, the third driving integrated circuit 725a may be mounted on the third driving film 720a by a chip on film method. A first side of the third driving film 720a may overlap with the third printed circuit board 630, and a second side of the third driving film 720a may overlap with the pad region 20 of the display panel 200. Here, the first side may be opposite to the second side. The third driving film 720a may further include wirings and pads, and the third driving film 720a may be electrically connected to the third printed circuit board 630 and the display panel 200 through the wirings and the pads.

Fifth data wirings 726a may be disposed in the pad region 20 of the display panel 200. For example, the fifth data wirings 726a may be disposed in the pad region 20 corresponding to a portion where the third driving film 720a is located in the pad region 20. The fifth data wirings 726a may include a plurality of electrodes. A first side of the fifth data wirings 726a may be coupled to the pads of the third driving film 720a, and a second side of the fifth data wirings 726a may be coupled to the pixels PX.

As described above, the third driving film 720a may receive the third signal from the first driving controller 515 through the wiring 621 of the third printed circuit board 630, and may provide the third signal to the pixels PX of the display panel 200 through the wirings and the pads of the third driving film 720a and the fifth data wirings 726a.

In addition, the third driving film 720b including the third driving integrated circuit 725b may be located on a right side of the third printed circuit board 630. Here, the integrated circuit 725b may be mounted on the third driving film 720b by a chip on film method. A first side of the third driving film 720b may overlap with the third printed circuit board 630, and a second side of the third driving film 720b may overlap with the pad region 20 of the display panel 200. Here, the first side may be opposite to the second side. The third driving film 720b may further include wirings and pads, and may be electrically connected to the third printed circuit board 630 and the display panel 200 through the wirings and the pads.

Sixth data wirings 726b may be disposed in the pad region 20 of the display panel 200. For example, the sixth data wirings 726b may be disposed in the pad region 20 corresponding to a portion where the third driving film 720b is located in the pad region 20. The sixth data wirings 726b may include a plurality of electrodes. A first side of the sixth data wirings 726b may be coupled to the pads of the third driving film 720b, and a second side of the sixth data wirings 726b may be coupled to the pixels PX.

As described above, the third driving film 720b may receive the third signal from the first driving controller 515 through the wiring 622 of the third printed circuit board 630, and may provide the third signal to the pixels PX of the display panel 200 through the wirings and the pads of the third driving film 720b and the sixth data wirings 726b. For example, the third driving films 720 may include a flexible printed circuit board or flexible flat cable, etc.

The fourth signal transmission film 645 may be located in a second portion of the third printed circuit board 630, and the first portion may be different from the second portion. In example embodiments, the third signal transmission film 640 and the fourth signal transmission film 645 may be located between the second driving films 620 and the third driving films 720. That is, the third signal transmission film 640 may be located adjacent to the fourth signal transmission film 645.

In other words, the fourth signal transmission film 645 may be located on a left side of the third printed circuit board 630, and the fourth signal transmission film 645, the third driving film 720a, and the third driving film 720b may be sequentially arranged along the second direction D2 on the third printed circuit board 630. In example embodiments, the fourth signal transmission film 645 may serve as a signal transmission film without a driving integrated circuit. A first side of the fourth signal transmission film 645 may overlap with the third printed circuit board 630, and a second side of the fourth signal transmission film 645 may overlap with the pad region 20 of the display panel 200. Here, the first side may be opposite to the second side.

As illustrated in FIG. 9, the fourth signal transmission film 645 may include a plurality of signal transmission wirings 646 and pads 647A and 647B. Here, the signal transmission wirings 646 may include a fourth signal transmission wiring 646a, a fourth signal transmission wiring 646b, a fourth signal transmission wiring 646c, a fourth signal transmission wiring 646d, a fourth signal transmission wiring 646e, and a fourth signal transmission wiring 646f. The fourth signal transmission film 645 may be electrically connected to the third printed circuit board 630 and the second connection electrodes 700 through the signal transmission wirings 646 and the pads 647A and 647B. For example, the wiring 623 of the third printed circuit board 630 may be coupled to the pads 647A of the fourth signal transmission film 645, and a second side of the second connection electrodes 700 may be coupled to the pads 647B of the fourth signal transmission film 645. As described above, the fourth signal transmission film 645 may receive the third signal of the first driving controller 515 provided to the second connection electrodes 700 through the signal transmission wirings 646 and the pads 647A and 647B, and the wiring 513 of the first printed circuit board 510, and may provide the third signal to the third driving films 720 through the wiring 623 of the third printed circuit board 630. For example, the fourth signal transmission film 645 may not include a driving integrated circuit, and may include a flexible printed circuit board or a flexible flat cable, etc., that primarily includes only wirings and pads.

Referring again to FIGS. 7 through 9, the second connection electrodes 700 may be disposed in the pad region 20 of the display panel 200. For example, the second connection electrodes 700 may be disposed in the pad region 20 corresponding to a portion where the third signal transmission film 640 and the fourth signal transmission film 645 are located in the pad region 20. The second connection electrodes 700 may include a plurality of electrodes 700a, 700b, 700c, 700d, 700e, and 700f. As described above, a first side of the second connection electrodes 700 may be coupled to the third signal transmission film 640, and a second side of the second connection electrodes 700 may be coupled to the fourth signal transmission film 645. Accordingly, the third signal generated from the first driving controller 515 may be transferred to the third printed circuit board 630 through the first signal transmission film 530, the first connection electrodes 1500, the second signal transmission film 535, the third signal transmission film 640, the second connection electrodes 700, and the fourth signal transmission film 645 without a connection cable connecting the second printed circuit board 520 and the third printed circuit board 630, and the third signal may be provided to the display panel 200 through the third driving films 720.

In example embodiments, the display device 800 includes one printed circuit board including a driving controller and two printed circuit boards without the driving controller, but embodiments of the present disclosure are not limited thereto. For example, in some example embodiments, the display device 800 may include one printed circuit board including a driving controller and at least three printed circuit boards without the driving controller.

Figure 10:
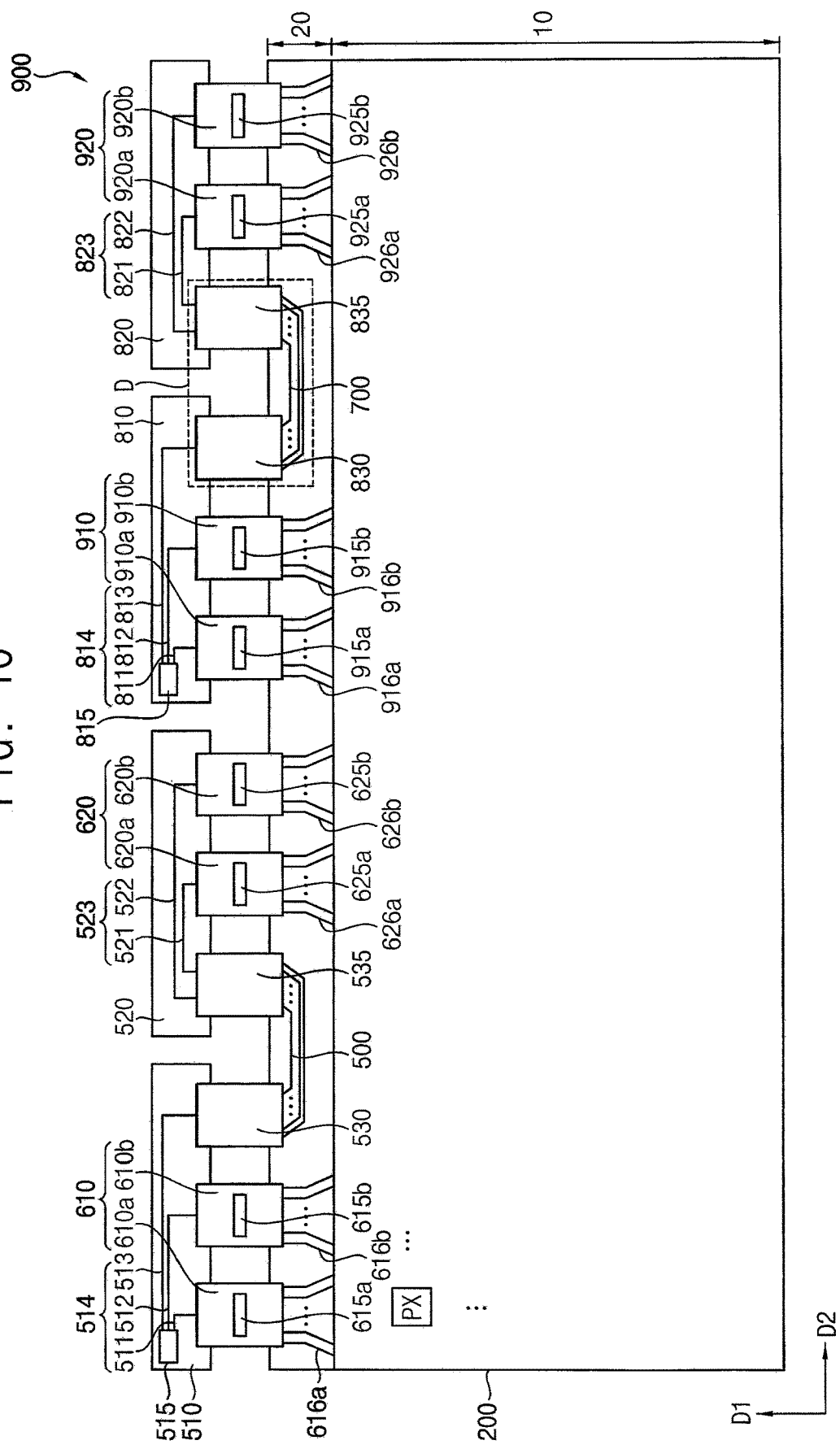
FIG. 10 is a plan view illustrating a display device in accordance with example embodiments.
Figure 11:
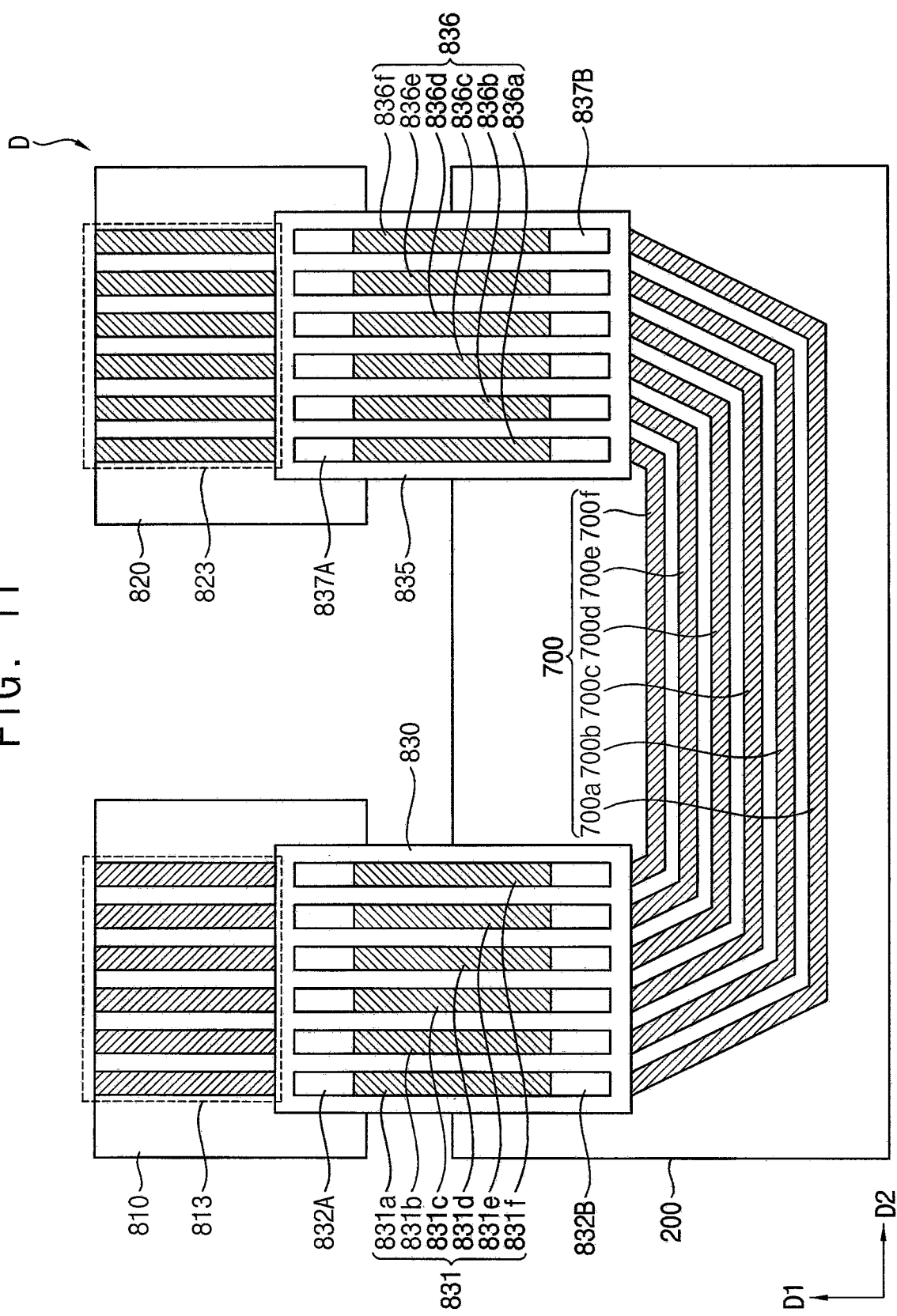
FIG. 11 is an enlarged plan view corresponding to region 'D' of the display device of FIG. 10.

FIG. 10 is a plan view illustrating a display device in accordance with example embodiments and FIG. 11 is an enlarged plan view corresponding to region 'D' of the display device of FIG. 10. An display device 900 illustrated in FIGS. 10 and 11 may have a configuration substantially the same as or similar to that of a display device 100 described with reference to FIGS. 1 through 6B except for a third printed circuit board 810, a fourth printed circuit board 820, fourth driving films 920, a fourth signal transmission film 835, and second connection electrodes 700. In FIGS. 10 and 11, detailed descriptions for elements that are substantially the same as or similar to elements described with reference to FIGS. 1 through 6B may not be repeated.

Referring to FIGS. 10 and 11, a display device 900 may include a display panel 200, a first printed circuit board 510, a second printed circuit board 520, a third printed circuit board 810, a fourth printed circuit board 820, first driving films 610, second driving films 620, third driving films 910, fourth driving films 920, a first signal transmission film 530, a second signal transmission film 535, a third signal transmission film 830, a fourth signal transmission film 835, first connection electrodes 500, second connection electrodes 700, etc. Here, the first printed circuit board 510 may include a first driving controller 515, and the first driving controller 515 may generate a first signal and a second signal. The third printed circuit board 810 may include a second driving controller 815, and the second driving controller 815 may generate a third signal and a fourth signal. In addition, the display panel 200 may have a display region 10 and a pad region 20 that is located at a side of the display region 10, and a plurality of pixels PX may be disposed in the display region 10. Further, the first driving films 610 may include a first driving film 610a including a first driving integrated circuit 615a and a first driving film 610b including a first driving integrated circuit 615b, and the second driving films 620 may include a second driving film 620a including a second driving integrated circuit 625a and a second driving film 620b including a second driving integrated circuit 625b. The third driving films 910 may include a third driving film 910a including a third driving integrated circuit 915a and a third driving film 910b including a third driving integrated circuit 915b, and the fourth driving films 920 may include a fourth driving film 920a including a fourth driving integrated circuit 925a and a fourth driving film 920b including a fourth driving integrated circuit 925b. In example embodiments, each of the second printed circuit board 520 and the fourth printed circuit board 820 may not include a driving controller, and each of the first signal transmission film 530, the second signal transmission film 535, the third signal transmission film 830, and the fourth signal transmission film 835 may not include a driving integrated circuit. In addition, the first connection electrodes 500 may electrically connect the first signal transmission film 530 and the second signal transmission film 535, and the second connection electrodes 700 may electrically connect the third signal transmission film 830 and the fourth signal transmission film 835.

The third printed circuit board 810 may be located spaced apart from the pad region 20 of the display panel 200 in a first direction D1, and may be located spaced apart from the second printed circuit board 520 in a second direction D2. In other words, the second printed circuit board 520 and the third printed circuit board 810 may be located adjacent to each other, and may be located substantially parallel to the pad region 20. In addition, the third printed circuit board 810 may include third wirings 814 and the second driving controller 815 capable of generating a plurality of signals. For example, the signals may be scan signals, data signals, power supply voltages, etc., so as to drive the pixels PX. The third printed circuit board 810 may include a wiring 811 connecting the second driving controller 815 and the third driving film 910a, a wiring 812 connecting the second driving controller 815 and the third driving film 910b, and a wiring 813 connecting the second driving controller 815 and the third signal transmission film 830 such that the second driving controller 815 transfers the signals to the third driving films 910 and the third signal transmission film 830 in the third printed circuit board 810. In addition, the third printed circuit board 810 may further include pads, and the pads may be disposed in a portion where the third printed circuit board 810 overlaps the third driving films 910 and the third signal transmission film 830. The third printed circuit board 810 may be electrically connected to the third driving films 910 and the third signal transmission film 830 through the pads. For example, the third printed circuit board 810 may include a rigid printed circuit board including a driving controller, a plurality of wirings, and pads.

In example embodiments, the second driving controller 815 may generate the third signal and the fourth signal, and the third signal and the fourth signal may be data signals. For example, the third signal may be transferred to the third driving films 910, and the fourth signal may be transferred to the third signal transmission film 830. Here, the third signal may be transferred to the third driving films 910 through the wirings 811 and 812 and the pads of the third printed circuit board 810, and the fourth signal may be transferred to the fourth driving films 920 through the second connection electrodes 700, the fourth signal transmission film 835, and the fourth printed circuit board 820 after the second signal is transferred to the third signal transmission film 830 through the wiring 813 and the pads of the third printed circuit board 810.

In example embodiments, each of the wirings 811, 812, and 813 included in the third printed circuit board 810 of FIG. 10 includes one wiring, but embodiments of the present disclosure are not limited thereto. For example, each of the wirings 811, 812, and 813 may include a plurality of wirings.

The fourth printed circuit board 820 may be located spaced apart from the pad region 20 of the display panel 200 in the first direction D1, and may be located spaced apart from the third printed circuit board 810 in the second direction D2. In other words, the third printed circuit board 810 and the fourth printed circuit board 820 may be located adjacent to each other, and may be located substantially parallel to the pad region 20.

In example embodiments, the fourth printed circuit board 820 may serve as a printed circuit board without a driving controller. The fourth printed circuit board 820 may receive the fourth signal generated from the second driving controller 815 of the third printed circuit board 810 through the fourth signal transmission film 835, and the fourth printed circuit board 820 may include a wiring 823 connecting the fourth signal transmission film 835 and the fourth driving films 920 such that the fourth signal is transferred to the fourth driving films 920. For example, the fourth printed circuit board 820 may include a wiring 821 connecting the fourth signal transmission film 835 and the fourth driving film 920a and a wiring 822 connecting the fourth signal transmission film 835 and the fourth driving film 920b such that the fourth signal provided in the fourth signal transmission film 835 is transferred to the fourth driving film 920a and the fourth driving film 920b in the fourth printed circuit board 820. In addition, the fourth printed circuit board 820 may further include pads, and the pads may be disposed in a portion where the fourth printed circuit board 820 overlaps with the fourth signal transmission film 835 and the fourth driving films 920. The fourth signal transmission film 835 may be electrically connected to the fourth driving films 920 through the pads. In other words, the fourth signal provided in the fourth signal transmission film 835 may be transferred to the fourth driving films 920 through the wirings 821 and 822 and the pads of the fourth printed circuit board 820. For example, the fourth printed circuit board 820 may include a rigid printed circuit board including a plurality of wirings and pads.

In example embodiments, each of the wirings 821 and 822 included in the fourth printed circuit board 820 of FIG. 10 includes one wiring, but embodiments of the present disclosure are not limited thereto. For example, each of the wirings 821 and 822 may include a plurality of wirings.

The third driving films 910 may be located in a first portion of the third printed circuit board 810, and may include driving integrated circuits, respectively. For example, the third driving film 910a including the third driving integrated circuit 915a may be located on a left side of the third printed circuit board 810. Here, the third driving integrated circuit 915a may be mounted on the third driving film 910a by a chip on film method. A first side of the third driving film 910a may overlap with the third printed circuit board 810, and a second side of the third driving film 910a may overlap with the pad region 20 of the display panel 200. Here, the first side may be opposite to the second side. The third driving film 910a may further include wirings and pads, and the third driving film 910a may be electrically connected to the third printed circuit board 810 and the display panel 200 through the wirings and the pads.

Fifth data wirings 916a may be disposed in the pad region 20 of the display panel 200. For example, the fifth data wirings 916a may be disposed in the pad region 20 corresponding to a portion where the third driving integrated circuit 915a is located in the pad region 20. The fifth data wirings 916a may include a plurality of electrodes. A first side of the fifth data wirings 916a may be coupled to the pads of the third driving film 910a, and a second side of the fifth data wirings 916a may be coupled to the pixels PX.

As described above, the third driving film 910a may receive the third signal from the second driving controller 815 through the wiring 811 of the third printed circuit board 810, and may provide the third signal to the pixels PX of the display panel 200 through the wirings and the pads of the third driving film 910a and the fifth data wirings 916a.

In addition, the third driving film 910b including the third driving integrated circuit 915b may be located in a center of the third printed circuit board 810. Here, the third driving integrated circuit 915b may be mounted on the third driving film 910b by a chip on film method. A first side of the third driving film 910b may overlap with the third printed circuit board 810, and a second side of the third driving film 910*b* may overlap with the pad region 20 of the display panel 200. Here, the first side may be opposite to the second side. The third driving film 910*b* may further include wirings and pads, and may be electrically connected to the third printed circuit board 810 and the display panel 200 through the wirings and the pads.

Sixth data wirings 916*b* may be disposed in the pad region 20 of the display panel 200. For example, the sixth data wirings 916*b* may be disposed in the pad region 20 corresponding to a portion where the third driving film 910*b* is located in the pad region 20. The sixth data wirings 916*b* may include a plurality of electrodes. A first side of the sixth data wirings 916*b* may be coupled to the pads of the third driving film 910*b*, and a second side of the sixth data wirings 916*b* may be coupled to the pixels PX.

As described above, the third driving film 910*b* may receive the third signal from the second driving controller 815 through the wiring 812 of the third printed circuit board 810, and may provide the third signal to the pixels PX of the display panel 200 through the wirings and the pads of the third driving film 910*b* and the sixth data wirings 916*b*. For example, the third driving films 910 may include a flexible printed circuit board or flexible flat cable, etc.

The third signal transmission film 830 may be located in a second portion of the third printed circuit board 810, and the first portion may be different from the second portion. In other words, the third signal transmission film 830 may be located on a right side of the third printed circuit board 810, and the third driving film 910*a*, the third driving film 910*b*, and the third signal transmission film 830 may be sequentially arranged along the second direction D2 on the third printed circuit board 810. In example embodiments, the third signal transmission film 830 may serve as a signal transmission film without a driving integrated circuit. A first side of the third signal transmission film 830 may overlap with the third printed circuit board 810, and a second side of the third signal transmission film 830 may overlap with the pad region 20 of the display panel 200. Here, the first side may be opposite to the second side.

As illustrated in FIG. 11, in example embodiments, the third signal transmission film 830 may include a plurality of signal transmission wirings 831 and pads 832A and 832B. Here, the signal transmission wirings 831 may include a third signal transmission wiring 831*a*, a third signal transmission wiring 831*b*, a third signal transmission wiring 831*c*, a third signal transmission wiring 831*d*, a third signal transmission wiring 831*e*, and a third signal transmission wiring 831*f*. The third signal transmission film 830 may be electrically connected to the third printed circuit board 810 and the second connection electrodes 700 through the signal transmission wirings 831 and the pads 832A and 832B. For example, the wiring 813 of the third printed circuit board 810 may be coupled to the pads 832A of the third signal transmission film 830, and a first side of the second connection electrodes 700 may be coupled to the pads 823B of the third signal transmission film 830. As described above, the third signal transmission film 830 may receive the fourth signal from the second driving controller 815 provided to the first connection electrodes 500 through the wiring 813 of the third printed circuit board 810, and may provide the fourth signal to the second connection electrodes 700 through the signal transmission wirings 831 and the pads 832A and 832B of the third signal transmission film 830. For example, the third signal transmission film 830 may not include a driving integrated circuit, and may include a flexible printed circuit board or a flexible flat cable, etc., that primarily includes only wirings and pads.

Referring again to FIGS. 10 and 11, the fourth driving films 920 may be located in a first portion of the fourth printed circuit board 820, and may include driving integrated circuits, respectively. For example, the fourth driving film 920*a* including the fourth driving integrated circuit 925*a* may be located in a center of the fourth printed circuit board 820. Here, the fourth driving integrated circuit 925*a* may be mounted on the fourth driving film 920*a* by a chip on film method. A first side of the fourth driving film 920*a* may overlap with the fourth printed circuit board 820, and a second side of the fourth driving film 920*a* may overlap with the pad region 20 of the display panel 200. Here, the first side may be opposite to the second side. The fourth driving film 920*a* may further include wirings and pads, and may be electrically connected to the fourth printed circuit board 820 and the display panel 200 through the wirings and the pads.

Seventh data wirings 926*a* may be disposed in the pad region 20 of the display panel 200. For example, the seventh data wirings 926*a* may be disposed in the pad region 20 corresponding to a portion where the fourth driving film 920*a* is located in the pad region 20. The seventh data wirings 926*a* may include a plurality of electrodes. A first side of the seventh data wirings 926*a* may be coupled to the pads of the fourth driving film 920*a*, and a second side of the seventh data wirings 926*a* may be coupled to the pixels PX.

As described above, the fourth driving film 920*a* may receive the fourth signal from the second driving controller 815 through the wiring 821 of the fourth printed circuit board 820, and may provide the fourth signal to the pixels PX of the display panel 200 through the wirings and the pads of the fourth driving film 920*a*.

In addition, the fourth driving film 920*b* including the fourth driving integrated circuit 925*b* may be located on a right side of the fourth printed circuit board 820. Here, the fourth driving integrated circuit 925*b* may be mounted on the fourth driving film 920*b* by a chip on film method. A first side of the fourth driving film 920*b* may overlap with the fourth printed circuit board 820, and a second side of the fourth driving film 920*b* may overlap with the pad region 20 of the display panel 200. Here, the first side may be opposite to the second side. The fourth driving film 920*b* may further include wirings and pads, and may be electrically connected to the fourth printed circuit board 820 and the display panel 200 through the wirings and the pads.

Eighth data wirings 926*b* may be disposed in the pad region 20 of the display panel 200. For example, the eighth data wirings 926*b* may be disposed in the pad region 20 corresponding to a portion where the fourth driving film 920*b* is located in the pad region 20. The eighth data wirings 926*b* may include a plurality of electrodes. A first side of the eighth data wirings 926*b* may be coupled to the pads of the fourth driving film 920*b*, and a second side of the eighth data wirings 926*b* may be coupled to the pixels PX.

As described above, the fourth driving film 920*b* may receive the fourth signal from the second driving controller 815 through the wiring 822 of the fourth printed circuit board 820, and may provide the fourth signal to the pixels PX of the display panel 200 through the wirings and the pads of the fourth driving film 920*b*. For example, the fourth driving films 920 may include a flexible printed circuit board or flexible flat cable, etc.

The fourth signal transmission film 835 may be located in a second portion of the fourth printed circuit board 820, and the first portion may be different from the second portion. In example embodiments, the second portion of the third printed circuit board 810 and the second portion of the fourth printed circuit board 820 may be located between the first portion of the third printed circuit board 810 and the first portion of the fourth printed circuit board 820, and the third signal transmission film 830 and the fourth signal transmission film 835 may be located between the third driving films 910 and the fourth driving films 920. That is, the third signal transmission film 830 may be located adjacent to the fourth signal transmission film 835.

In other words, the fourth signal transmission film 835 may be located on a left side of the fourth printed circuit board 820, and the fourth signal transmission film 835, the fourth driving film 920*a*, and the fourth driving film 920*b* may be sequentially arranged along the second direction D2 on the fourth printed circuit board 820. In example embodiments, the fourth signal transmission film 835 may serve as a signal transmission film without a driving integrated circuit. A first side of the fourth signal transmission film 835 may overlap with the fourth printed circuit board 820, and a second side of the fourth signal transmission film 835 may overlap with the pad region 20 of the display panel 200. Here, the first side may be opposite to the second side.

As illustrated in FIG. 11, in example embodiments, the fourth signal transmission film 835 may include a plurality of signal transmission wirings 836 and pads 837A and 837B. Here, the signal transmission wirings 836 may include a fourth signal transmission wiring 836*a*, a fourth signal transmission wiring 836*b*, a fourth signal transmission wiring 836*c*, a fourth signal transmission wiring 836*d*, a fourth signal transmission wiring 836*e*, and a fourth signal transmission wiring 836*f*. The fourth signal transmission film 835 may be electrically connected to the fourth printed circuit board 820 and the second connection electrodes 700 through the signal transmission wirings 836 and the pads 837A and 837B. For example, the wiring 823 of the fourth printed circuit board 820 may be coupled to the pads 837A of the fourth signal transmission film 835, and a second side of the second connection electrodes 700 may be coupled to the pads 837B of the fourth signal transmission film 835. As described above, the fourth signal transmission film 835 may receive the fourth signal of the second driving controller 815 provided to the second connection electrodes 700 through the signal transmission wirings 836 and the pads 837A and 837B, and the wiring 513 of the first printed circuit board 510, and may provide the fourth signal to the fourth driving films 920 through the wiring 823 of the fourth printed circuit board 820. For example, the fourth signal transmission film 835 may not include a driving integrated circuit, and may include a flexible printed circuit board or a flexible flat cable, etc., that primarily includes only wirings and pads.

Referring again to FIGS. 10 and 11, the second connection electrodes 700 may be disposed in the pad region 20 of the display panel 200. For example, the second connection electrodes 700 may be disposed in the pad region 20 corresponding to a portion where the third signal transmission film 830 and the fourth signal transmission film 835 are located in the pad region 20. The second connection electrodes 700 may include a plurality of electrodes 700*a*, 700*b*, 700*c*, 700*d*, 700*e*, and 700*f*. As described above, a first side of the second connection electrodes 700 may be coupled to the third signal transmission film 830, and a second side of the second connection electrodes 700 may be coupled to the fourth signal transmission film 835. Accordingly, the fourth signal generated from the second driving controller 815 may be transferred to the fourth printed circuit board 820 through the third signal transmission film 830, the second connection electrodes 700, and the fourth signal transmission film 835 without a connection cable connecting the third printed circuit board 810 and the fourth printed circuit board 820, and the fourth signal may be provided to the display panel 200 through the fourth driving films 920.

The present invention may be applied to various display devices. For example, the present invention may be applied to a vehicle-display device, a ship-display device, an aircraft-display device, a portable communication device, a display device for display or for information transfer, a medical-display device, etc.

It will be understood that when an element or layer is referred to as being "on," or "connected to" another element or layer, it can be directly on or connected to the other element or layer or intervening elements or layers may be present. When an element is referred to as being "directly on" or "directly connected to" another element or layer, there are no intervening elements or layers present. As used herein, the term "and/or" includes any and all combinations of one or more of the associated listed items Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and equivalents thereof.

What is claimed is:

1. A display device, comprising:
    a display panel having a display region and a pad region at a side of the display region;
    a first printed circuit board spaced apart from the pad region of the display panel, the first printed circuit board comprising a first driving controller configured to generate a plurality of signals;
    a second printed circuit board adjacent to the first printed circuit board;
    a first driving film electrically connected to the first printed circuit board, the first driving film comprising a first driving integrated circuit;
    a second driving film electrically connected to the second printed circuit board, the second driving film comprising a second driving integrated circuit;
    a first signal transmission film electrically connected to the first printed circuit board, the first signal transmission film comprising first signal transmission wirings; and
    a second signal transmission film electrically connected to the second printed circuit board and the first signal transmission film, the second signal transmission film comprising second signal transmission wirings.

2. A display device, comprising: a display panel having a display region and a pad region at a side of the display region; a first printed circuit board spaced apart from the pad region of the display panel, the first printed circuit board comprising a first driving controller configured to generate a plurality of signals; a second printed circuit board adjacent to the first printed circuit board; a first driving film electrically connected to the first printed circuit board, the first driving film comprising a first driving integrated circuit; a second driving film electrically connected to the second printed circuit board, the second driving film comprising a second driving integrated circuit; a first signal transmission film electrically connected to the first printed circuit board, the first signal transmission film comprising first signal transmission wirings; and a second signal transmission film electrically connected to the second printed circuit board and the first signal transmission film, the second signal transmission film comprising second signal transmission wirings, wherein the first driving film is in a first portion of the first printed circuit board, and the first signal transmission film is in a second portion of the first printed circuit board different from the first portion of the first printed circuit board, wherein the second driving film is in a first portion of the second printed circuit board, and the second signal transmission film is in a second portion of the second printed circuit board different from the first portion of the second printed circuit board, and wherein the first driving film and the first signal transmission film are coupled to the display panel and the first printed circuit board, and the second driving film and the second signal transmission film are coupled to the display panel and the second printed circuit board.

3. The display device of claim 1, wherein the first signal transmission film and the second signal transmission film are between the first driving film and the second driving film.

4. The display device of claim 1, further comprising:
first connection electrodes in the pad region corresponding to a portion where the first signal transmission film and the second signal transmission film are in the pad region of the display panel,
wherein a first side of the first connection electrodes is coupled to the first signal transmission film, and a second side of the first connection electrodes is coupled to the second signal transmission film.

5. The display device of claim 4, wherein the first driving controller is configured to generate a first signal and a second signal, and the first signal is to be provided to the display panel through the first driving film, and
wherein the second signal is to be provided to the display panel through the second driving film after the second signal is transferred to the second printed circuit board through the first signal transmission film, the second signal transmission film, and the first connection electrodes.

6. The display device of claim 1, wherein each of the first signal transmission film and the second signal transmission film does not include a driving integrated circuit.

7. The display device of claim 1, wherein the second printed circuit board does not include a driving controller.

8. The display device of claim 1, further comprising:
a third signal transmission film electrically connected to the second printed circuit board, the third signal transmission film comprising third signal transmission wirings;
a third printed circuit board adjacent to the second printed circuit board;
a third driving film electrically connected to the third printed circuit board, the third driving film comprising a third driving integrated circuit; and
a fourth signal transmission film electrically connected to the third printed circuit board and the third signal transmission film, the fourth signal transmission film comprising fourth signal transmission wirings.

9. The display device of claim 8, wherein the second driving film is in a first portion of the second printed circuit board, and the second signal transmission film is in a second portion of the second printed circuit board,
wherein the third signal transmission film is in a third portion opposite to the first portion of the second printed circuit board, and the first portion of the second printed circuit board is different from the second portion of the second printed circuit board,
wherein the third driving film is in a first portion of the third printed circuit board, and the fourth signal transmission film is in a second portion of the third printed circuit board,
wherein the second signal transmission film, the second driving film, and the third signal transmission film are configured to connect the display panel and the second printed circuit board, and the third driving film and the fourth signal transmission film are configured to connect the display panel and the third printed circuit board, and
wherein the third portion of the second printed circuit board and the second portion of the third printed circuit board are between the first portion of the second printed circuit board and the first portion of the third printed circuit board.

10. The display device of claim 8, wherein the third signal transmission film and the fourth signal transmission film are between the second driving film and the third driving film.

11. The display device of claim 8, further comprising:
second connection electrodes in the pad region corresponding to a portion where the third signal transmission film and the fourth signal transmission film are in the pad region of the display panel,
wherein a first side of the second connection electrodes is coupled to the third signal transmission film, and a second side of the second connection electrodes is coupled to the fourth signal transmission film.

12. The display device of claim 8, wherein each of the third signal transmission film and the fourth signal transmission film does not include a driving integrated circuit, and the third printed circuit board does not include a driving controller.

13. The display device of claim 8, wherein the driving controller is configured to generate a first signal, a second signal, and a third signal, and the first signal is to be provided to the display panel through the first driving film, and
wherein the second signal and the third signal are to be provided to the second printed circuit board through the first signal transmission film and the second signal transmission film, the second signal is to be provided to the display panel through the second driving film, and
wherein the third signal is to be provided to the display panel through the third driving film after the third signal is transferred to the third printed circuit board through the third signal transmission film and the fourth signal transmission film.

14. The display device of claim 1, further comprising:
a third printed circuit board adjacent to the second printed circuit board, the third printed circuit board comprising a second driving controller configured to generate a plurality of signals;
a fourth printed circuit board adjacent to the third printed circuit board;
a third driving film electrically connected to the third printed circuit board, the third driving film comprising a third driving integrated circuit;
a fourth driving film electrically connected to the fourth printed circuit board, the fourth driving film comprising a fourth driving integrated circuit;
a third signal transmission film electrically connected to the third printed circuit board, the third signal transmission film comprising third signal transmission wirings; and
a fourth signal transmission film electrically connected to the fourth printed circuit board and the third signal transmission film, the fourth signal transmission film comprising fourth signal transmission wirings.

15. The display device of claim 14, wherein the third driving film is in a first portion of the third printed circuit board, and the third signal transmission film is in a second portion different from the first portion of the third printed circuit board,
wherein the fourth driving film is in a first portion of the fourth printed circuit board, and the fourth signal transmission film is in a second portion different from the first portion of the third printed circuit board,
wherein the third driving film and the third signal transmission film are configured to connect the display panel and the third printed circuit board, and the fourth driving film and the fourth signal transmission film are configured to connect the display panel and the fourth printed circuit board, and
wherein the third signal transmission film and the fourth signal transmission film are between the third driving film and the fourth driving film.

16. The display device of claim 14, further comprising:
second connection electrodes in the pad region corresponding to a portion where the third signal transmission film and the fourth signal transmission film are in the pad region of the display panel,
wherein a first side of the second connection electrodes is coupled to the third signal transmission film, and a second side of the second connection electrodes is coupled to the fourth signal transmission film.

17. The display device of claim 14, wherein each of the third signal transmission film and the fourth signal transmission film does not include a driving integrated circuit, and the fourth printed circuit board does not include a driving controller.

18. The display device of claim 14, wherein the first driving controller is configured to generate a first signal and a second signal, and the first signal is to be provided to the display panel through the first driving film,
wherein the second signal is to be provided to the display device through the second driving film after the second signal is transferred to the second printed circuit board through the first signal transmission film and the second signal transmission film,
wherein the second driving controller is configured to generate a third signal and a fourth signal, and the third signal is to be provided to the display device through the third driving film, and
wherein the fourth signal is to be provided to the display panel through the fourth driving film after the fourth signal is transferred to the fourth printed circuit board through the third signal transmission film and the fourth signal transmission film.

19. The display device of claim 1, wherein after the first driving film, the second driving film, the first signal transmission film, and the second signal transmission film are bent, and the first printed circuit board and the second printed circuit board are on a bottom surface of the display panel.

* * * * *